US 10,725,379 B2

(12) United States Patent
Ono et al.

(10) Patent No.: US 10,725,379 B2
(45) Date of Patent: Jul. 28, 2020

(54) POLYIMIDE PRECURSOR RESIN COMPOSITION

(71) Applicant: Hitachi Chemical DuPont MicroSystems, Ltd., Tokyo (JP)

(72) Inventors: Keishi Ono, Ibaraki (JP); Tetsuya Enomoto, Ibaraki (JP); Masayuki Ohe, Ibaraki (JP); Keiko Suzuki, Ibaraki (JP); Kazuya Soejima, Ibaraki (JP); Etsuharu Suzuki, Ibaraki (JP)

(73) Assignee: Hitachi Chemical DuPont MicroSystems, Ltd., Tokyo (JP)

( * ) Notice: Subject to any disclaimer, the term of this patent is extended or adjusted under 35 U.S.C. 154(b) by 0 days.

(21) Appl. No.: 14/654,740

(22) PCT Filed: Dec. 13, 2013

(86) PCT No.: PCT/JP2013/007345
§ 371 (c)(1),
(2) Date: Jun. 22, 2015

(87) PCT Pub. No.: WO2014/097594
PCT Pub. Date: Jun. 26, 2014

(65) Prior Publication Data
US 2015/0337116 A1 Nov. 26, 2015

(30) Foreign Application Priority Data

Dec. 21, 2012 (JP) .................................. 2012-279340

(51) Int. Cl.
*G03F 7/038* (2006.01)
*G03F 7/075* (2006.01)
(Continued)

(52) U.S. Cl.
CPC .......... *G03F 7/0388* (2013.01); *C08F 290/14* (2013.01); *C08G 73/1007* (2013.01); *C08G 73/1039* (2013.01); *C08G 73/1067* (2013.01); *C08K 5/33* (2013.01); *C08K 5/5442* (2013.01); *C08K 5/5455* (2013.01); *C09D 179/08* (2013.01); *G03F 7/0387* (2013.01);
(Continued)

(58) Field of Classification Search
CPC .......... G03F 7/027; G03F 7/40; G03F 7/0751; G03F 7/0387
USPC ...................................... 430/270.1, 325, 330
See application file for complete search history.

(56) References Cited

U.S. PATENT DOCUMENTS 4,811,082 A 3/1989 Jacobs et al.
5,019,482 A * 5/1991 Ai .......................... G03F 7/031
430/281.1

(Continued)

FOREIGN PATENT DOCUMENTS

CN 101866707 A 10/2010
JP 5-295115 A 11/1993
(Continued)

OTHER PUBLICATIONS

Website https://www.Gelest.com/product/sit8188.0/ (page as seen attached to a Word document) (Year: 2000).*
Office Action issued in co-pending related U.S. Appl. No. 14/654,758 dated Oct. 7, 2015.
Coburn et al "Relaxation Behavior of Polyimides based on 2,2'-Disubstituted Benzidines", Macromolecules, 1995, vol. 28, pp. 3253-3260.
Sasaki et al , Accession No. 1999:101110, from Scifinder database, English abstract and compounds listed in Registry therefore of JP 11-035684 Patent information dated Feb. 9, 1999, 14 pages.
(Continued)

*Primary Examiner* — John S Chu
(74) *Attorney, Agent, or Firm* — Merchant & Gould, P.C.

(57) ABSTRACT

A resin composition including the following components (a) and (b). (a) A polyimide precursor having a structural unit represented by the following general formula (1); and (b) a compound represented by the following general formula (2): wherein in the formula $R^1$ is a tetravalent organic group, $R^2$ is a divalent organic group and $R^3$ and $R^4$ are independently a hydrogen atom, an alkyl group, a cycloalkyl group or a monovalent organic group having a carbon-carbon unsaturated double bond. $R^5$ is an alkyl group having 1 to 4 carbon atoms, $R^6$ is independently a hydroxyl group or an alkyl group having 1 to 4 carbon atoms, a is an integer of 0 to 3, n is an integer of 1 to 6, and $R^7$ is a group represented by the following general formula (3) or (4): wherein in the formula (3) or (4), $R^8$ is an alkyl group having 1 to 10 carbon atoms or a monovalent organic group derived from hydroxyalkylsilane and $R^9$ is an alkyl group having 1 to 10 carbon atoms, a monovalent organic group derived from aminoalkylsilane or a heterocyclic group, and $R^8$ and $R^9$ may independently have a substituent.

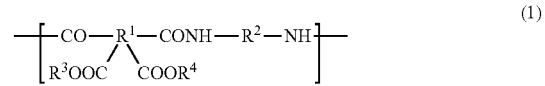

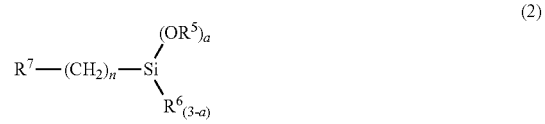

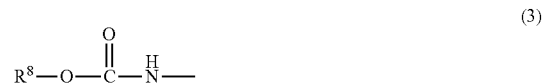

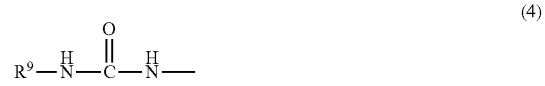

10 Claims, 1 Drawing Sheet

(51) Int. Cl.
*G03F 7/40* (2006.01)
*C08G 73/10* (2006.01)
*C08K 5/544* (2006.01)
*C08K 5/33* (2006.01)
*G03F 7/16* (2006.01)
*G03F 7/20* (2006.01)
*G03F 7/32* (2006.01)
*C09D 179/08* (2006.01)
*C08K 5/5455* (2006.01)
*C08F 290/14* (2006.01)

(52) U.S. Cl.
CPC .......... *G03F 7/0751* (2013.01); *G03F 7/0755* (2013.01); *G03F 7/16* (2013.01); *G03F 7/20* (2013.01); *G03F 7/32* (2013.01); *G03F 7/40* (2013.01); *Y10T 428/24479* (2015.01)

(56) References Cited

U.S. PATENT DOCUMENTS

| | | | |
|---|---|---|---|
| 5,260,408 | A | 11/1993 | Auman |
| 5,310,625 | A | 5/1994 | Angelopoulous et al. |
| 6,162,580 | A | 12/2000 | Matsuoka et al. |
| 6,340,506 | B1 * | 1/2002 | Buchecker ........... C08G 73/101 428/1.26 |
| 6,482,569 | B1 | 11/2002 | Matsuoka et al. |
| 6,610,815 | B1 | 8/2003 | Hata et al. |
| 7,416,822 | B2 | 8/2008 | Kanada et al. |
| 8,173,349 | B2 * | 5/2012 | Hikita ................... C08G 75/23 430/270.1 |
| 8,735,534 | B2 | 5/2014 | Wu et al. |
| 2002/0032273 | A1 | 3/2002 | Tanaka et al. |
| 2006/0240358 | A1 * | 10/2006 | Powell ...................... G03F 7/09 430/311 |
| 2007/0154843 | A1 * | 7/2007 | Kanada ................. C08G 73/10 430/311 |
| 2009/0202794 | A1 * | 8/2009 | Shibui ................... G03F 7/0045 428/195.1 |
| 2009/0233228 | A1 * | 9/2009 | Shibui ................... G03F 7/0233 430/281.1 |
| 2010/0168265 | A1 | 7/2010 | Wu et al. |
| 2010/0244644 | A1 | 9/2010 | Kim et al. |
| 2010/0244655 | A1 | 9/2010 | Kim et al. |
| 2011/0086311 | A1 * | 4/2011 | Katayama .............. C08G 73/10 430/280.1 |
| 2011/0242468 | A1 | 10/2011 | Choi et al. |
| 2012/0248634 | A1 | 10/2012 | Mitsukura et al. |
| 2012/0251949 | A1 * | 10/2012 | Miyabe .................. C08G 73/10 430/283.1 |
| 2014/0343199 | A1 * | 11/2014 | Malik ................. C08G 73/1032 524/109 |

FOREIGN PATENT DOCUMENTS

| | | | |
|---|---|---|---|
| JP | 7-242744 | A | 9/1995 |
| JP | 7-304950 | A | 11/1995 |
| JP | 08-231718 | A | 9/1996 |
| JP | 2826940 | B2 | 9/1998 |
| JP | 11-35684 | A | 2/1999 |
| JP | 11-338157 | A | 12/1999 |
| JP | 2000-344940 | A | 12/2000 |
| JP | 2001-254014 | A | 9/2001 |
| JP | 2002-131905 | A | 5/2002 |
| JP | 2002-265631 | A | 9/2002 |
| JP | 3526829 | B2 | 2/2004 |
| JP | 2004-182962 | A | 7/2004 |
| JP | 2006-509888 | A | 3/2006 |
| JP | 4144110 | B2 | 6/2008 |
| JP | 2008-216569 | A | 9/2008 |
| JP | 4524808 | B2 | 6/2010 |
| JP | 2010-236000 | A | 10/2010 |
| JP | 2011-164454 | A | 8/2011 |
| JP | 6245180 | B2 | 12/2017 |
| TW | 200536877 | A | 11/2005 |
| TW | 201024337 | A | 7/2010 |
| WO | 2004/055592 | A2 | 7/2004 |
| WO | 2014/073591 | A1 | 5/2014 |

OTHER PUBLICATIONS

English translation of JP, 11-035684, A (1999) from machine translation from AIPN Japan Patent Office National Center for Industrial Property Information and Training, generated Sep. 29, 2015, 9 pages.
Hasegawa et ai, "Low-CTE Polyimides Derived from 2,3,6,7-Naphthalenetetracarboxylic Dianhydride", Polymer Journal, vol. 39, No. 6, pp. 610-621, Year 2007.
Pyo et al "Synthesis and Characterization of Fully Rodlike Poly(4,4'-biphenylne pyromellitimide)s with Various Short Side Groups", Journal of Polymer Science: Part A: Polymer Chemistry, vol. 37, John Wiley & Sons, Inc, 1999, pp. 937-957.
Dine-Hart et al "Effect of Structural Variations on the Thermo-oxidative Stability of Aromatic Polyimides", De Makromolekulare Chemi, vol. 153 (1972) pp. 237-254.
International Search Report issued in application PCT/JP2013/007345, completed Mar. 3, 2014 and dated Mar. 11, 2014.
English translation of the International Preliminary Report on Patentability in application PCT/JP2013/007345, dated Jun. 23, 2015.
International Search Report issued in application PCT/JP2013/007467, completed Mar. 10, 2014 and dated Mar. 18, 2014.
English translation of the International Preliminary Report on Patentability in application PCT/JP2013/0073467 dated Jun. 23, 2015.
Office action issued in related Chinese application 201380067191.7 dated Jul. 5, 2016 (no translation available; submitted for certification).
Office Action issued in corresponding Taiwanese patent application 102147060 dated Apr. 11, 2017. (No translation available; submitted for certification).
Office Action issued in corresponding Japanese application 2014-552922 drafted on Jul. 27, 2017 and dated Aug. 1, 2017, with machine translation.

* cited by examiner

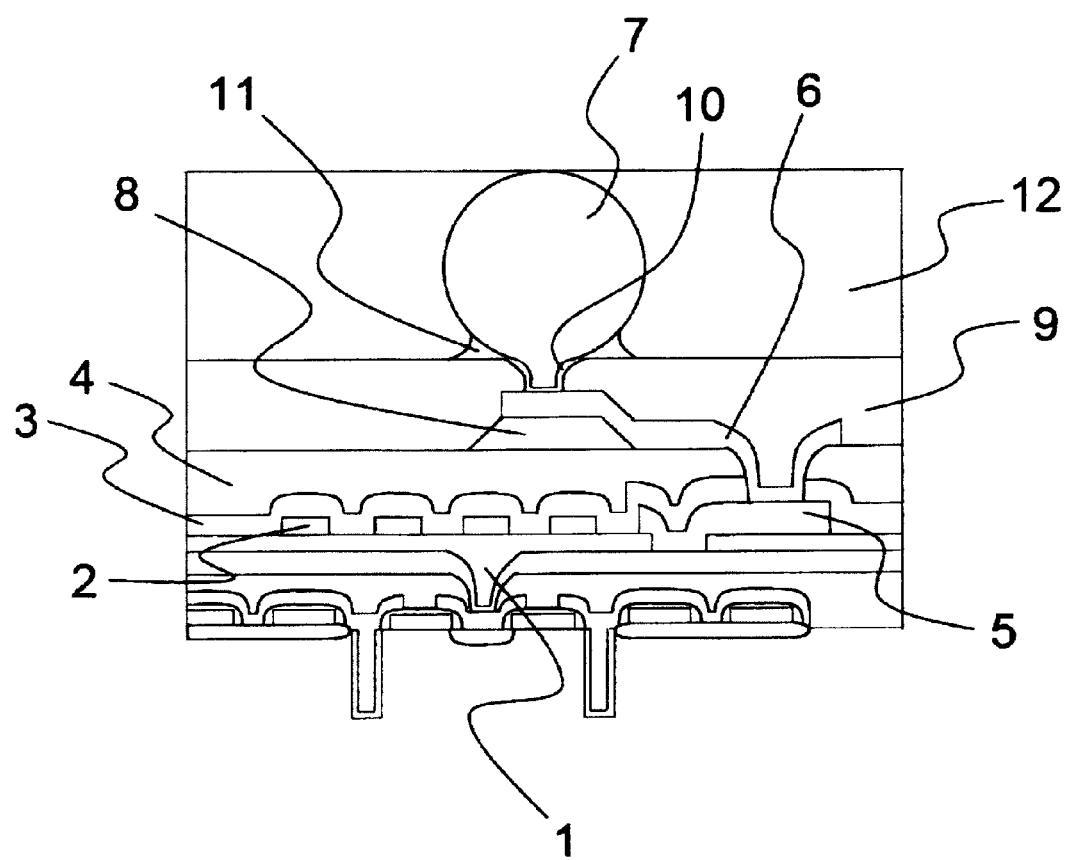

POLYIMIDE PRECURSOR RESIN COMPOSITION

This is a National Phase Application in the United States of International Patent Application No. PCT/JP2013/007345 filed Dec. 13, 2013, which claims priority on Japanese Patent Application No. 2012-279340, filed Dec. 21, 2012. The entire disclosures of the above patent applications are hereby incorporated by reference.

TECHNICAL FIELD

The present invention relates to a resin composition that is excellent in storage stability and is capable of forming a cured film having a low stress and improved adhesiveness with a substrate, and to a method for producing a pattern using this resin composition.

BACKGROUND ART

With miniaturization in an integrated circuit of a semiconductor, an interlayer insulating film called a "low-k layer" for lowering a dielectric constant has been required. However, since the low-k layer has a void structure, a problem arises that mechanical strength is lowered. In order to protect an interlayer insulating film having such a weak mechanical strength, a cured film formed of a polyimide resin is used. This cured film is required to have properties such as capability of being thick and having a high modulus elasticity. However, due to an increase in thickness and an increase in modulus elasticity, the stress after curing may increase, and problems may arise that transfer or securing of a wafer may not necessarily be conducted smoothly due to significant warpage of a semiconductor wafer. Under such circumstances, development of a cured film having a low stress has been desired.

In order to allow a cured film to have a low stress while keeping high thermal resistance and excellent mechanical properties of a polyimide resin, it has been reported that it is effective to decrease the coefficient of thermal expansion by allowing the polyimide skeleton to be rigid and linear.

Further, if a resin film is formed to have a large thickness in view of protection of a low-k layer, there is a problem that the transmittance of i-line that is used for forming a pattern in a resin film is lowered, and as a result, formation of a pattern becomes impossible. On the other hand, in order to increase i-line transmittance of a coating film, a method has been proposed to use a polyimide precursor containing fluorine.

However, there is a disadvantage that a cured film obtained by curing by heating a polyimide precursor containing fluorine has low adhesiveness to silicon wafer used as a substrate (Patent Documents 1 and 2, for example).

Further, in order to attain excellent adhesiveness with silicon wafer, use of 3-isocianatopropyltriethoxysilane as a resin composition has been reported (Patent Document 3, for example). However, there is a problem that the storage stability of the resin composition is lowered due to the presence of an isocyanate group having a high reactivity.

RELATED ART DOCUMENTS

Patent Documents

Patent Document 1: Japanese Patent No. 2826940
Patent Document 2: Japanese Patent No. 4144110
Patent Document 3: JP-A-H11-338157

SUMMARY OF THE INVENTION

In order to solve such problems, an object of the present invention is to provide a resin composition that has excellent storage stability and is capable of forming a cured film that has a low stress and has excellent adhesiveness with a substrate, and as well as to provide a method for producing a cured film using this resin composition.

The present invention relates to the following:

<1> A resin composition comprising the following components (a) and (b)

(a) a polyimide precursor having a structural unit represented by the following general formula (1):

(b) a compound represented by the following general formula (2):

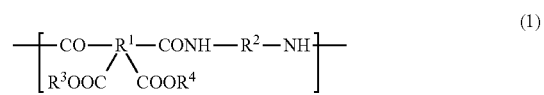

wherein $R^1$ is a tetravalent organic group, $R^2$ is a divalent organic group, $R^3$ and $R^4$ are independently a hydrogen atom, an alkyl group, a cycloalkyl group or a monovalent organic group having a carbon-carbon unsaturated double bond.

wherein $R^5$ is an alkyl group having 1 to 4 carbon atoms, $R^6$ is independently a hydroxyl group or an alkyl group having 1 to 4 carbon atoms, a is an integer of 0 to 3, n is an integer of 1 to 6, and $R^7$ is a group represented by the following general formula (3) or a group represented by the following general formula (4):

wherein $R^8$ is an alkyl group having 1 to 10 carbon atoms or a monovalent organic group derived from hydroxyalkylsilane, $R^9$ is an alkyl group having 1 to 10 carbon atoms, a monovalent organic group derived from aminoalkylsilane or a heterocyclic group, and $R^8$ and $R^9$ each may have a substituent.

<2> The resin composition in which the component (b) is at least one or more of compounds represented by the following general formulas:

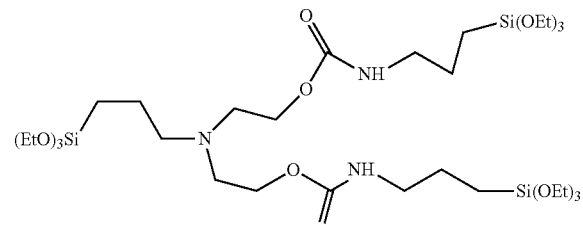

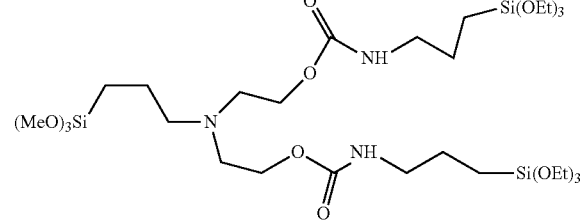

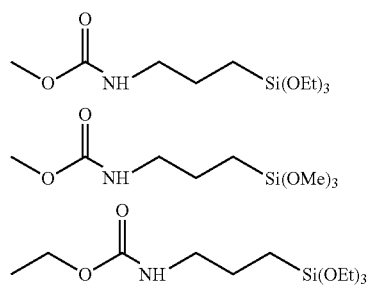

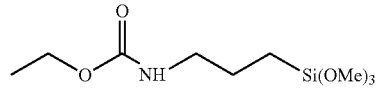

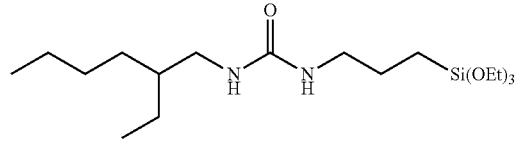

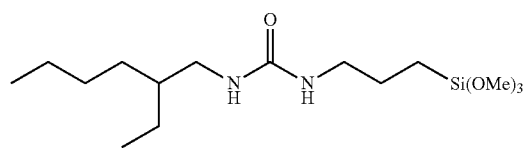

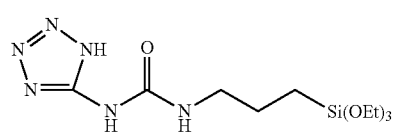

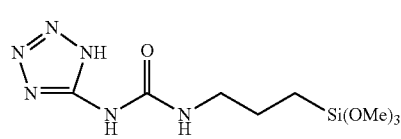

<3> The resin composition in which $R^2$ in the general formula (1) showing a polyimide precursor (a) is a divalent organic group represented by the following general formula (5):

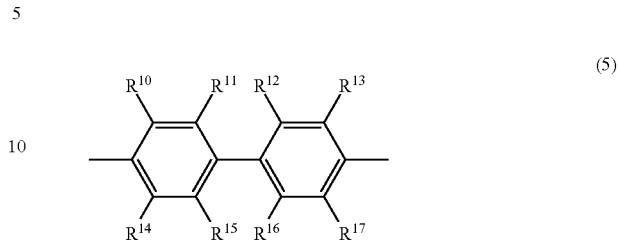

wherein $R^{10}$ to $R^{17}$ are independently a hydrogen atom, a fluorine atom or a monovalent organic group, and at least one of $R^{10}$ to $R^{17}$ is a fluorine atom or a trifluoromethyl group.

<4> The resin composition in which $R^2$ in the general formula (1) showing a polyimide precursor (a) is a divalent organic group represented by the following general formula (6):

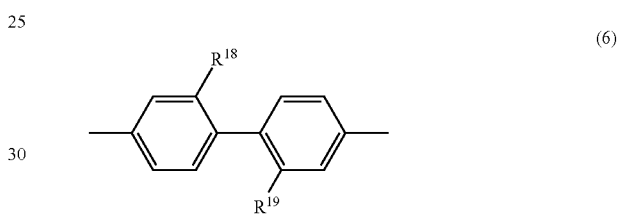

wherein $R^{18}$ and $R^{19}$ are independently a fluorine atom or a trifluoromethyl group.

<5> The resin composition that further comprises a compound (c) that generates a radical upon irradiation with active rays <6> The resin composition in which the compound (c) that generates a radical upon irradiation with active rays is an oxime ester compound <7> A cured film formed from the resin composition <8> A method for producing a cured film comprising: a step of applying the resin composition to a substrate, followed by drying, thereby to form a coating film; and a step of subjecting the coating film to a heat treatment <9> A patterned cured film formed from the resin composition <10> A method for producing a patterned cured film comprising: a step of applying the resin composition to a substrate, followed by drying, thereby to form a coating film; a step of irradiating the coating film with active rays, followed by development to obtain a patterned resin film; and a step of subjecting the patterned resin film to a heat treatment According to the present invention, it is possible to provide a resin composition that has excellent storage stability and is capable of forming a cured film that has a low stress and has excellent adhesiveness with a substrate, and as well as to provide a method for producing a cured film using this resin composition.

BRIEF DESCRIPTION OF THE DRAWINGS

FIG. 1 is a schematic cross-sectional view of one embodiment of a semiconductor device using the resin composition of the present invention.

MODE FOR CARRYING OUT THE INVENTION

Hereinbelow, a detailed explanation will be made on the embodiments of the resin composition, the patterned cured film obtained by using the resin composition, the method for producing the patterned cured film and the electronic components of the present invention. The present invention is not restricted to the embodiments.

<Resin Composition>

The resin composition of the present invention comprises the following components (a) and (b):
(a) a polyimide precursor having a structural unit represented by the following general formula (1)
(b) a compound represented by the following general formula (2)

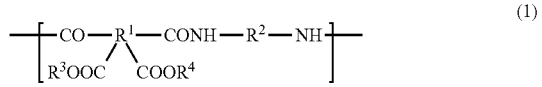

wherein $R^1$ is a tetravalent organic group, $R^2$ is a divalent organic group and $R^3$ and $R^4$ are independently a hydrogen atom, an alkyl group, a cycloalkyl group or a monovalent organic group having a carbon-carbon unsaturated double bond.

wherein $R^5$ is an alkyl group having 1 to 4 carbon atoms, $R^6$ is independently a hydroxyl group or an alkyl group having 1 to 4 carbon atoms, a is an integer of 0 to 3, n is an integer of 1 to 6 and $R^7$ is a group represented by the following general formula (3) or a group represented by the following general formula (4):

$R^8$ is an alkyl group having 1 to 10 carbon atoms or a monovalent organic group derived from hydroxyalkylsilane, $R^9$ is an alkyl group having 1 to 10 carbon atoms, a monovalent organic group derived from aminoalkylsilane or a heterocyclic group, and $R^8$ and $R^9$ each may have a substituent.

The component (B) is an adhesion aid. In the present invention, due to the above-mentioned configuration, a state is attained where a highly reactive isocyanate group is protected. Accordingly, as compared with a case where a conventional adhesion aid is used, a resin composition having excellent storage stability can be obtained. Further, the resulting cured film has a low stress and excellent adhesiveness with a substrate. Hereinbelow, a detailed explanation will be made on each component.

Component (a): Polyimide Precursor Having a Structural Unit Represented by the General Formula (1)

The resin composition of the present invention comprises (a) a polyimide precursor comprising a structural unit represented by the following general formula (1):

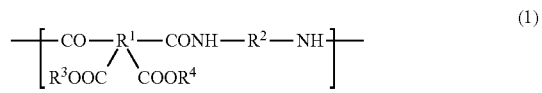

wherein $R^1$ is a tetravalent organic group, $R^2$ is a divalent organic group, $R^3$ and $R^4$ are independently a hydrogen atom, an alkyl group, a cycloalkyl group or a monovalent organic group having a carbon-carbon unsaturated double bond.

The residual stress of the cured film obtained by applying the polyimide precursor represented by the general formula (1) to a substrate, followed by curing by heating is preferably 30 MPa or less when the film thickness of the cured film is 10 μm, more preferably 27 MPa or less, and further preferably 25 MPa or less. If the residual stress is 30 MPa or less, when a film is formed to have a thickness of 10 μm after curing, wafer warpage can be suppressed more sufficiently, whereby problems that occur during transfer or securing by sucking of a wafer can be suppressed more sufficiently.

The residual stress can be measured by a method in which the warpage of a wafer is measured by means of a thin film stress measurement apparatus (FLX-2320, manufactured by KLA Tencor Japan), and the amount of the warpage is converted to a stress.

In order to allow the cured film obtained in the present invention to have a thickness of 10 μm after curing, after the step of forming a coating film by applying the resin composition to a substrate and drying, the coating film is required to be formed in a thickness of about 20 μm. Therefore, when a photosensitive resin composition is formed by combining with a compound that generates a radical upon irradiation with active rays, it is important to have a high i-line transmittance.

Specifically, in a film thickness of 20 μm, the i-line transmittance is preferably 5% or more, more preferably 8% or more, and further preferably 15% or more, with 30% or more being particularly preferable. If the i-line transmittance is lower than 5%, the i-line does not reach deep inside the film, and radicals are not generated sufficiently, whereby photosensitive properties may be deteriorated; e.g. oozing out of the resin from the substrate of the film at the time of development may occur.

The i-line transmittance can be measured by measuring the transmitted UV spectrum by means of a U-3310 spectrophotometer (manufactured by Hitachi, Ltd.).

$R^1$ in the general formula (1) is a structure derived from tetracarboxylic dianhydride used as a raw material. In respect of stress of a cured film, $R^1$ is preferably pyromellitic dianhydride, 2,3,6,7-naphthalene tetracarboxylic dianhydride and 3,3',4,4'-biphenyltetracarboxylic dianhydride. These can be used singly or in combination of two or more.

Further, within a range that does not lower the stress and the i-line transmittance of a cured film, it may be used in combination with 3,3',4,4'-benzophenonetetracarboxylic dianhydride, 1,2,5,6-naphthalenetetracarboxylic dianhydride, 2,3,5,6-pyridinetetracarboxylic dianhydride, 1,4,5,8-naphthalenetetracarboxylic dianhydride, 3,4,9,10-perylene tetracarboxylic dianhydride, m-terphenyl-3,3',4,4'-tetracarboxylic dianhydride, p-terphenyl-3,3',4,4'-tetracarboxylic dianhydride, 1,1,1,3,3,3-hexafluoro-2,2-bis(2,3-dicarboxyphenyl)propane dianhydride, 1,1,1,3,3,3-hexafluoro-2,2-bis(3,4-dicarboxyphenyl)propane dianhydride, 2,2-bis(2,3-dicarboxyphenyl)propane dianhydride, 2,2-bis(3,4-dicarboxyphenyl)propane dianhydride, 2,2-bis{4'-(2,3-dicarboxyphenoxyl)phenyl}propane dianhydride, 2,2-bis{4'-(3,4-dicarboxyphenoxyl)phenyl}propane dianhydride, 1,1,1,3,3,3-hexafluoro-2,2'-bis{4'-(2,3-dicarboxyphenoxyl)phenyl}propane dianhydride, 1,1,1,3,3,3-hexafluoro-2,2'-bis{4-(3,4-dicarboxyphenoxyl)phenyl}propane dianhydride, 4,4'-oxydiphthalic dianhydride, 4,4'-sulfonyldiphthalic dianhydride, or the like.

$R^2$ in the general formula (1) is a structure derived from diamine used as a raw material. In respect of i-line transmittance, it is preferred that $R^2$ in the general formula (1) be a divalent organic group represented by the following general formula (5) or (6).

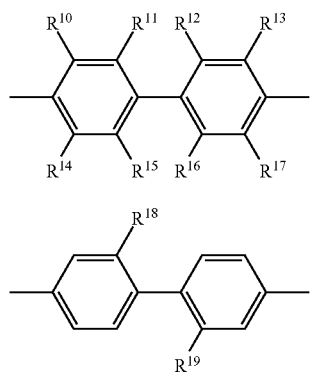

wherein $R^{19}$ to $R^{17}$ are independently a hydrogen atom, a fluorine atom or a monovalent organic group, and at least one of $R^{19}$ to $R^{17}$ is a fluorine atom or a trifluoromethyl group, and $R^{18}$ and $R^{19}$ are independently a fluorine atom or a trifluoromethyl group.

In particular, in respect of i-line transmittance and easiness in availability, it is more preferred that $R^2$ in the general formula (1) be a divalent organic group represented by the general formula (6).

In the component (a), in $R^2$ in the general formula (1), the structural unit represented by the general formula (6) is preferably 1 to 100 mol %, more preferably 10 to 90 mol %, and further preferably 30 to 90 mol %.

As the organic group that provides the structure represented by the general formula (5) or (6), in respect of low stress, good i-line transmittance, heat resistance or the like, 2,2'-bis(trifluoromethyl)-4,4'-diaminobiphenyl, 2,2'-bis(fluoro)-4,4'-diaminobiphenyl and 4,4'-diaminooctafluorobiphenyl can be given. These can be used singly or in combination of two or more.

Further, within a range that does not deteriorate the low stress, and does not lower the good i-line transmittance, heat resistance or the like, it is possible to use a diamine compound that provides a structure other than those represented by the general formulas (5) and (6). For example, p-phenylenediamine, m-phenylenediamine, p-xylylenediamine, m-xylylenediamine, 1,5-diaminonaphthalene, benzidine, 4,4'-(or 3,4'-,3,3'-,2,4'-,2,2'-)diaminodiphenyl ether, 4,4'-(or 3,4'-,3,3'-,2,4'-,2,2'-)diaminodiphenyl sulfone, 4,4'-(or 3,4'-,3,3'-,2,4'-,2,2'-)diaminodiphenyl sulfide, o-tolidine, o-tolidine sulfone, 4,4'-methylene-bis-(2,6-diethylaniline), 4,4'-methylene-bis-(2,6-diisopropylaniline), 2,4-diaminomesitylene, 1,5-aminonaphthalene, 4,4'-benzophenonediamine, bis-{4-(4'-aminophenoxy)phenyl}sulfone, 2,2-bis{4-(4'-aminophenoxyl)phenyl}propane, 3,3'-dimethyl-4,4'-diaminodiphenylmethane, 3,3',5,5'-tetramethyl-4,4'-diaminodiphenylmethane, bis{4-(3'-aminophenoxyl)phenyl}sulfone, 2,2-bis(4-aminophenyl)propane and diaminopolysiloxane can be given. These are used singly or in combination of two or more.

As $R^3$ and $R^4$ in the general formula (1), a hydrogen atom, an alkyl group including 1 to 20 carbon atoms, a cycloalkyl group having 3 to 20 carbon atoms, an acryloxyalkyl group having 1 to 10 carbon atoms or a methacryloxyalkyl group of which the number of carbon atoms of the alkyl group is 1 to 10 can independently be given.

In order to allow it to be a photosensitive resin composition, it is preferred that a compound in which at least one of $R^3$ and $R^4$ has a carbon-carbon unsaturated double bond such as an acryloxyalkyl group having 1 to 10 carbon atoms or a methacryloxyalkyl group having 1 to 10 carbon atoms be combined with a compound that generates a radical upon irradiation with active rays, whereby cross-linkage between molecular chains by radical polymerization become possible.

The component (a) of the present invention can be synthesized by subjecting tetracarboxylic dianhydride and a diamine to addition polymerization. Further, it can also be synthesized by allowing a tetracarboxylic dianhydride represented by the formula (10) to be a diester derivative, converting the derivative to an acid chloride represented by the formula (11), and then reacting with a diamine represented by the formula (12):

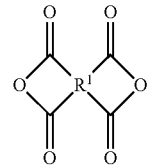

(10)

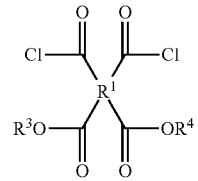

(11)

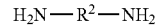

(12)

wherein $R^1$ to $R^4$ are as defined in the formula (1).

The tetracarboxylic mono(di)ester dichloride represented by the general formula (11) can be obtained by reacting a tetracarboxylic mono(di)ester that is obtained by reacting a tetracraboxylic dianhydride represented by the general formula (10) and a compound represented by the general formula (13) with a chlorinating agent such as thionyl chloride or dichlorooxalic acid.

$R^{22}$—OH    (13)

wherein $R^{22}$ is a hydrogen atom, an alkyl group or a monovalent organic group including a carbon-carbon unsaturated double bond.

As for the chlorinating agent, normally 2 molar equivalents of a chlorinating agent per mole of tetracarboxylic mono(di)ester are reacted in the presence of a basic compound in an amount twice as large as that of the chlorinating agent. In order to control the molecular weight of the polyimide precursor synthesized, the equivalence may be appropriately adjusted. As for the equivalence of the chlorinating agent, 1.5 to 2.5 molar equivalents are preferable, 1.6 to 2.4 molar equivalents are more preferable, with 1.7 to 2.3 molar equivalents being further preferable. If the equivalence is smaller than 1.5 molar equivalents, the low stress after curing may not be exhibited sufficiently due to a small molecular weight of a polyimide precursor. If the equivalence is larger than 2.5 molar equivalents, a large amount of hydrochloride of the basic compound may remain in the polyimide precursor, and as a result, the electric insulating properties of the polyimide after curing may be lowered. As the basic compound, pyridine, 4-dimethylaminopyridine, triethylamine or the like can be used. It is preferred that it be used in an amount of 1.5 to 2.5 times as that of the chlorinating agent. The amount of the chlorinating agent is more preferably 1.7 to 2.4 times, further preferably 1.8 to 2.3 times. If the amount is less than 1.5 times, the molecular weight of the polyimide precursor may be decreased, and the stress after curing may not be lowered sufficiently. If the amount is larger than 2.5 times, the polyimide precursor may be colored.

The tetracarboxylic dianhydride and the compound represented by the general formula (13) can be synthesized by reacting in the presence of a basic catalyst. As examples of the basic catalyst, 1,8-diazabicyclo[5.4.0]undeca-7-ene, 1,5-diazabicyclo[4.3.0]nona-5-ene or the like can be given.

Among the compounds represented by the formula (13), as alcohols, an alcohol in which $R^{22}$ is an alkyl group having 1 to 20 carbon atoms or a cycloalkyl group having 3 to 20 carbon atoms can be given.

As the monovalent organic group having a carbon-carbon unsaturated double bond shown by $R^{22}$, an acryloxyalkyl group of which the number of carbon atoms of the alkyl group is 1 to 10 and a methacryloxyalkyl group of which the number of carbon atoms of the alkyl group is 1 to 10 can be given.

Specifically, methanol, ethanol, n-propanol, isopropanol, n-butanol, 2-butanol, t-butanol, hexanol, cyclohexanol, 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, 4-hydroxybutyl acrylate, 4-hydroxybutyl methacrylate or the like can be given. These may be used singly or in combination of two or more.

As for the molecular weight of the polyimide precursor of the present invention, the weight-average molecular weight in terms of polystyrene is preferably 10,000 to 100,000, more preferably 15,000 to 100,000, and further preferably 20,000 to 85,000. If the weight-average molecular weight is 10,000 or more, the stress after curing may tend to be lowered sufficiently. In respect of solubility in a solvent and handling properties of a solution, the weight-average molecular weight is preferably 100,000 or less. The weight-average molecular weight can be measured by the gel permeation chromatography and can be obtained by converting by using a standard polystyrene calibration curve.

When the polyimide precursor of the present invention is synthesized, the molar ratio of tetracarboxylic dianhydride and diamine is normally 1.0. In order to suppress the molecular weight or the terminal residue, it may be conducted at a molar ratio of 0.7 to 1.3. If the molar ratio is 0.7 or less or 1.3 or more, the molecular weight of the resulting polyimide precursor is decreased, and the low stress after curing may not be sufficiently exhibited.

It is preferred that the addition polymerization and the condensation reaction and synthesis of a diester derivative and an acid chloride be conducted in an organic solvent. As the organic solvent used, a polar solvent that perfectly dissolves the polyimide precursor is preferable. N-methyl-2-pyrrolidone, N,N-dimethylacetoamide, N,N-dimethylformamide, dimethylsulfoxide, tetramethylurea, hexamethylphosphoric triamide, γ-butyrolactone or the like can be given.

In addition to the above-mentioned polar solvent, ketones, esters, lactones, ethers, halogenated hydrocarbons, hydrocarbons or the like can be used.

Specific examples thereof include acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofurane, dichloromethane, 1,2-dichloroethane, 1,4-dichlorobutane, trichloroethane, chlorobenzene, o-dichlorobenzene, hexane, heptane, octane, benzene, toluene, xylene or the like can be given. These organic solvents may be used singly or in combination of two or more.

As for the heating temperature for converting the polyimide precursor as the component (a) of the present invention into a polyimide by promoting imidization by heating, 80 to 450° C. is preferable. Heating temperature is more preferably 100 to 450° C., with 200 to 400° C. being further preferable. If the heating temperature is 80° C. or less, imidization may not proceed sufficiently, resulting in lowered heat resistance. If the heating temperature is 450° C. or higher, polyimide obtained by curing may be deteriorated.

Component (b): Compound Represented by General Formula (2)

In respect of improving adhesiveness of the resulting cured film with a substrate, the resin composition of the present invention comprises, as component (b), a compound represented by the following general formula (2).

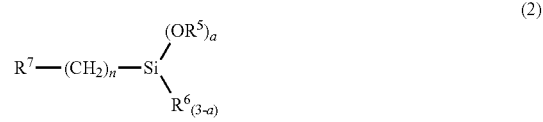

(2)

wherein $R^5$ is an alkyl group having 1 to 4 carbon atoms, $R^6$ is independently a hydroxyl group or an alkyl group having 1 to 4 carbon atoms, a is an integer of 0 to 3, n is an integer of 1 to 6, and $R^7$ is any of a group represented by the following general formula (3) or a group represented by the following general formula (4):

(3)

(4)

wherein $R^8$ is an alkyl group having 1 to 10 carbon atoms or an organic group derived from hydroxyalkylsilane, $R^9$ is an alkyl group having 1 to 10 carbon atoms, an organic group derived from aminoalkylsilane or a heterocyclic group, and $R^8$ and $R^9$ may independently have a substituent.

Due to the presence of the compound represented by the general formula (2) as the component (b), the resin composition of the present invention can exhibit good adhesiveness to a substrate when forming into a cured film. The reason therefor is assumed to be as follows. During the heat-curing step of the resin film, a protective group of an isocyanate of the compound represented by the general formula (2) is removed, and a highly reactive isocyanate group is regenerated and then reacted with carboxylic acid or an amine at the terminal of a polymer (polyimide precursor), thereby to form a chemical bond.

Due to the presence of the compound represented by the general formula (2) as the component (b), the resin composition of the present invention can exhibit good storage stability. The reason therefor is supposed to be as follows. The protected isocyanate of the compound represented by the general formula (2) is in a state having poor reactivity in which no protective group is removed prior to the heat curing step.

The compound represented by the formula (2) is a compound obtained by mixing a compound represented by the formula (14) and a compound having a hydroxyl group or an amino group, followed by addition reaction.

(14)

wherein $R^{29}$ is an alkyl group having 1 to 4 carbon atoms, $R^{39}$ is independently a hydroxyl group or an alkyl group having 1 to 4 carbon atoms; b is an integer of 0 to 3, and $R^{28}$ is an alkylene group having 1 to 6 carbon atoms.

As the compound represented by the formula (14), 1-isocyanatomethyltrimethylsilane, 1-isocyanatomethyltriethylsilane, 1-isocyanatomethyltripropylsilane, 1-isocyanatomethyltributylsilane, 1-isocyanatomethyltrimethoxysilane, 1-isocyanatomethyldimethoxymethylsilane, 1-isocyanatomethylmethoxydimethylsilane, 1-isocyanatomethyltriethoxysilane, 1-isocyanatomethyltripropoxysilane, 1-isocyanatomethyltributoxysilane, 1-isocyanatomethyldiethoxyethylsilane, 3-isocyanatopropyltrimethylsilane, 3-isocyanatopropyltriethylsilane, 3-isocyanatopropyltrimethoxysilane, 3-isocyanatopropyldimethoxymethylsilane, 3-isocyanatopropylmethoxydimethylsilane, 3-isocyanatopropyltriethoxysilane, 3-isocyanatopropyldiethoxyethylsilane, 3-isocyanatopropylethoxydiethylsilane, 6-isocyanatohexyltrimethoxysilane, 6-isocyanatohexyldimethoxymethylsilane, 6-isocyanatohexylmethoxydimethylsilane, 6-isocyanatohexyltriethoxysilane, 6-isocyanatohexyldiethoxyethylsilane, 6-isocyanatohexylethoxydiethylsilane or the like can be given. In respect of easiness in availability, 3-isocyanatopropyltrimethoxysilane and 3-isocyanatopropyltriethoxysilane are preferable.

In the compound represented by the formula (2), a compound in which $R^7$ is represented by the formula (3) is a compound obtained by reacting a compound represented by the formula (14) with a compound having a hydroxyl group and a compound having hydroxyalkylsilane. This reaction formula is shown as the following formula (15):

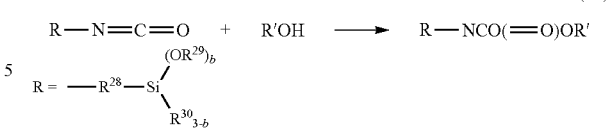

(15)

wherein in the formula, R is a group in the formula (14) and R' is an alkyl group having 1 to 10 carbon atoms.

If a compound in which R' is an alkyl group having 1 to 10 carbon atoms is reacted with the compound represented by the formula (14), a compound represented by the formula (3) in which $R^8$ is an alkyl group having 1 to 10 carbon atoms is obtained. As the compound having 1 to 10 carbon atoms and having a hydroxyl group, methanol, ethanol, n-propanol, isopropanol, n-butanol, 2-butanol, t-butanol, hexanol, heptanol, octanol, nonal, decanol, 2-methyl-1-hexanol, 3-methyl-1-hexanol, 4-methyl-1-hexanol, 5-methyl-1-hexanol, 2-ethyl-1-hexanol, 3-ethyl-1-hexanol, 4-ethyl-1-hexanol, 2,2-dimethyl-1-propanol, cyclohexanol or the like can be given.

When a hydroxyalkylsilane compound is reacted with the compound represented by the formula (14), a compound in which $R^8$ in the formula (3) has an organic group derived from hydroxyalkylsilane is obtained. As the hydroxyalkylsilane compound, bis(2-hydroxyethyl)-3-aminopropyltriethoxysilane, N,N-bis(2-hydroxyethyl)-N,N-bis(trimethoxysilylpropyl)ethylenediamine, N-(hydroxymethyl)-N-methylaminopropyltrimethoxysilane, 7-triethoxysilylpropoxy-5-hydroxyflavone, N-(3-triethoxysilylpropyl)-4-hydroxybutylamide, 2-hydroxy-4-(3-methyldiethoxysilylpropoxy)diphenylketone, 1,3-bis(4-hydroxybutyl)tetramethyldisiloxane, 3-(N-acetyl-4-hydroxypropyloxy)propyltriethoxysilane, hydroxymethyltriethoxysilane or the like can be exemplified. Among them, bis(2-hydroxyethyl)-3-aminopropyltriethoxysilane is preferable.

In the compound represented by the formula (2), a compound in which $R^7$ is represented by the formula (4) is a compound obtained by reacting the compound represented by the formula (14) with a compound having 1 to 10 carbon atoms and having an amino group, an aminoalkylsilane compound or a heterocyclic compound having an amino group. This reaction formula is shown as the following formula (16):

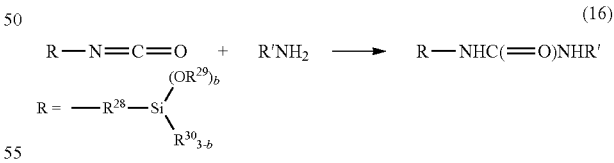

(16)

wherein in the formula, R is a group in the formula (14) and R' is an alkyl group having 1 to 10 carbon atoms.

When a compound in which R' is an alkyl group having 1 to 10 carbon atoms is reacted with the compound represented by the formula (14), a compound in which $R^9$ in the formula (4) is an alkyl group having 1 to 10 carbon atoms is obtained. As the compound having an amino group and having 1 to 10 carbon atoms, aminomethane, aminoethane, aminopropane, aminobutane, aminopentane, aminohexane, aminoheptane, aminooctane, aminononane, aminodecane, 2-ethylaminohexane or the like can be given.

When the aminoalkylsilane compound is reacted with the compound represented by the formula (14), a compound in which $R^9$ in the formula (4) has an organic group derived from aminoalkylsilane is obtained. As the aminoalkylsilane compound, 4-aminobutyltriethoxysilane, 4-amino-3,3-dimethylbutyltrimethoxysiloxane, N-(2-aminoethyl)-3-aminopropylmethyldimethoxysilane, N-(2-aminoethyl)-4-aminopropylmethyltriethoxysilane or the like can be given.

When a heterocyclic compound having an amino group is reacted with the compound represented by the formula (14), a compound in which $R^9$ in the formula (4) is a heterocyclic group is obtained. As the heterocyclic compound having an amino group, 5-aminotetrazole, 3-amino-1,2,4-triazole, 4-amino-1,2,4-triazole, 4-aminopyridine, 2-aminopyridine, 3-aminopyridine, 2,6-diaminopyridine, 3,4-diaminopyridine, 2-aminothiazole, 2-aminobenzothiazole or the like can be given.

The reaction represented by the formula (15) and the reaction represented by the formula (16) may be conducted at room temperature or may be reacted in a temperature range of 50° C. to 100° C. The raw materials may be reacted directly or may be reacted by using a solvent such as dimethylformamide, 1,2-diethoxyethane and N-methylpyrrolidone.

In respect of attaining a higher degree of adhesiveness and more improved storage stability, it is preferred that the component (b) comprise at least one of the following compounds.

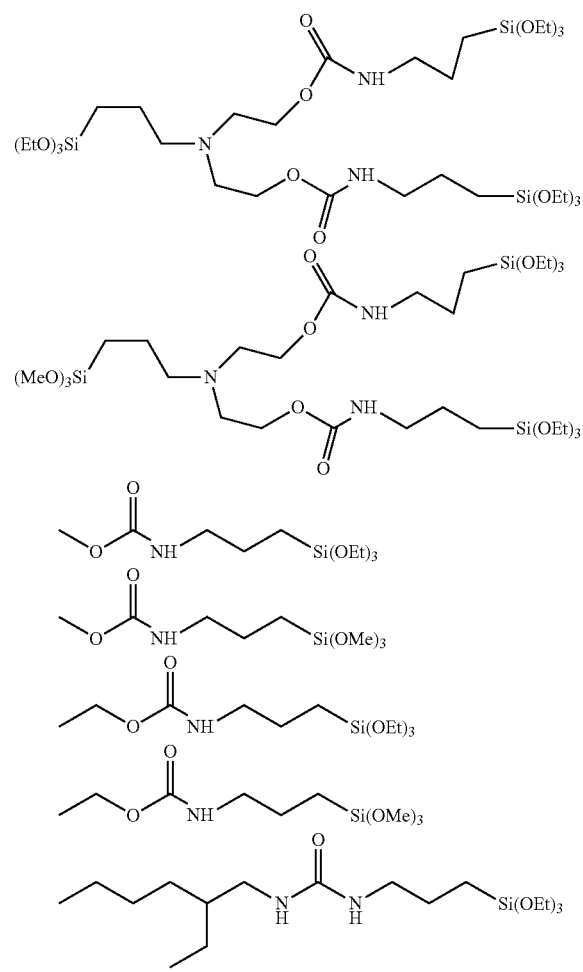

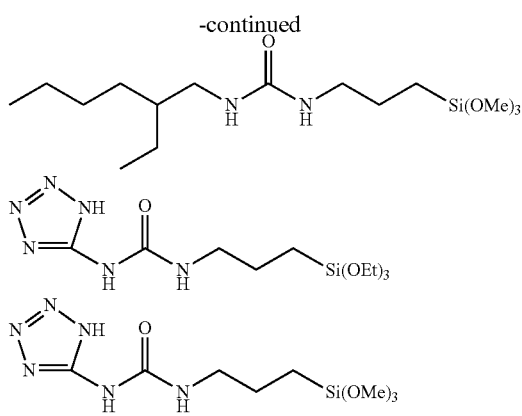

The content of the component (b) is preferably 0.1 to 20 parts by mass, more preferably 1 to 10 parts by mass, and further preferably 1 to 6 parts by mass relative to 100 parts by mass of the component (a). If the content is 0.1 part by mass or more, more sufficient adhesiveness with the substrate can be imparted. If the content is 20 parts by mass or less, a problem of viscosity increase during storage at room temperature can be suppressed more sufficiently.

The resin composition of the present invention may comprise other organic silane compounds than the component (b) in order to further improve adhesiveness with a silicon substrate or the like after curing. As the organic silane compound, γ-aminopropyltrimethoxysilane, γ-aminopropyltriethoxysilane, vinyltriethoxysilane, vinyltrimethoxysilane, γ-glycidoxypropyltriethoxysilane, γ-glycidoxypropyltrimethoxysilane, γ-methacryloxypropyltrimethoxysilane, γ-acryloxypropyltrimethoxysilane, 3-ureidopropyltriethoxysilane, 3-mercaptopropyltrimethoxysilane, triethoxysilylpropylethylcarbamate, 3-(triethoxysilyl)propyl succinic anhydride, phenyltriethoxysilane, phenyltrimethoxysilane, N-phenyl-3-aminopropyltrimethoxysilane, 3-triethoxysilyl-N-(1,3-dimethylbutylidene)propylamine, 2-(3,4-epoxycyclohexyl)ethyltrimethoxysilane or the like can be given. The amount thereof is appropriately adjusted such that intended effects can be obtained.

Component (c): Compound that Generates Radical Upon Irradiation with Active Rays When at least part of $R^3$ or $R^4$ in the polyimide precursor as the component (a) is a monovalent organic group having a carbon-carbon unsaturated double bond, by dissolving it in a solvent in combination with a compound that generates radical upon irradiation with active rays, it can be a photosensitive resin composition. In the present invention, when a photosensitive resin composition is obtained by containing the component (c), the composition preferably becomes a resin composition having excellent i-line transmittance.

As the component (c), an aromatic ketone such as an oxime ester compound mentioned later, benzophenone, N,N'-tetraalkyl-4,4'-diaminobenzophenone such as N,N'-tetramethyl-4,4'-diaminobenzophenone (Michler's ketone), 2-benzyl-2-dimethylamino-1-(4-morpholinophenyl)-butanone-1,2-methyl-1-[4-(methylthio)phenyl]-2-morpholinopropanone-1 or the like; quinones fused to an aromatic ring such as alkylanthraquinones; a benzoin ether compound such as alkylbenzoin; a benzoin compound such as benzoin and alkylbenzoin; and a benzyl derivative such as benzyl dimethyl ketal can be given.

Among these, due to excellent sensitivity and capability of providing an excellent pattern, an oxime ester compound is preferable.

In respect of capability of obtaining good sensitivity and residual film ratio, the oxime ester compound mentioned above may preferably be any of the compound represented by the following formula (17), the compound represented by the following formula (18) and the compound represented by the following formula (19).

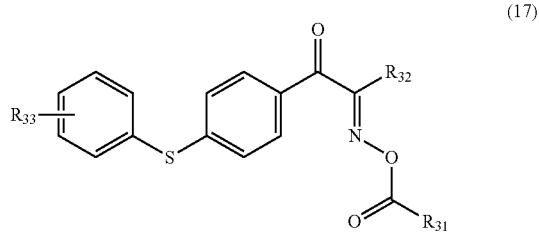
(17)

wherein in the formula (17), $R_{31}$ and $R_{32}$ are independently an alkyl group having 1 to 12 carbon atoms, a cycloalkyl group having 4 to 10 carbon atoms or a phenyl group. It is preferred that $R_{31}$ and $R_{32}$ be an alkyl group having 1 to 8 carbon atoms, a cycloalkyl group having 4 to 6 carbon atoms or a phenyl group. It is more preferred that $R_{31}$ and $R_{32}$ be an alkyl group having 1 to 4 carbon atoms, a cycloalkyl group having 4 to 6 carbon atoms or a phenyl group. A methyl group, a cyclopentyl group or a phenyl group is further preferable.

$R_{33}$ is more preferably H, OH, COOH, $O(CH_2)OH$, $O(CH_2)_2OH$, $COO(CH_2)OH$ or $COO(CH_2)_2OH$. H, $O(CH_2)OH$, $O(CH_2)_2OH$, $COO(CH_2)OH$ or $COO(CH_2)_2OH$, with H, $O(CH_2)_2OH$ or $COO(CH_2)_2OH$ being more preferable.

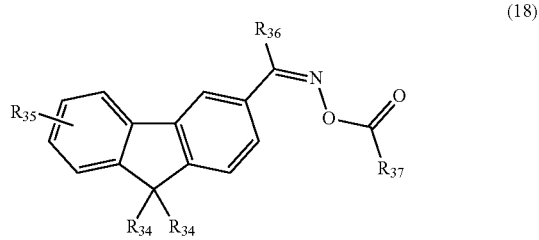
(18)

wherein in the formula (18), $R_{34}$ is independently an alkyl group having 1 to 6 carbon atoms, and is preferably a propyl group.

$R_{35}$ is $NO_2$ or ArCO (wherein Ar is an aryl group). As the Ar, a tolyl group is preferable.

$R_{36}$ and $R_{37}$ are independently an alkyl group having 1 to 12 carbon atoms, a phenyl group or a tolyl group, and preferably a methyl group, a phenyl group or a tolyl group.

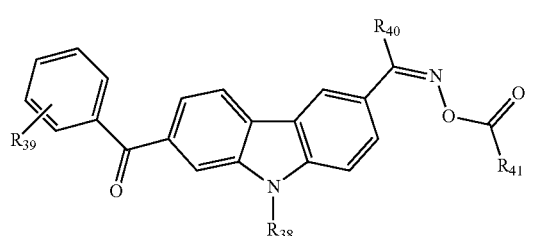
(19)

wherein in the formula (19), $R_{38}$ is an alkyl group having 1 to 6 carbon atoms, and is preferably an ethyl group.

$R_{39}$ is an organic group having an acetal bond and is preferably a substituent corresponding to $R_8$ contained in a compound represented by the following formula (19-1), mentioned later.

$R_{40}$ and $R_{41}$ are independently an alkyl group having 1 to 12 carbon atoms, a phenyl group or a tolyl group, and are preferably a methyl group, a phenyl group or a tolyl group, with a methyl group being more preferable.

As the compound represented by the formula (17), a compound represented by the following formula (17-1) or a compound represented by the following formula (17-2) can be given, for example. Among these, the compound represented by the following formula (17-1) is available as IRGACURE OXE-01 (product name, manufactured by BASF Japan, Ltd.)

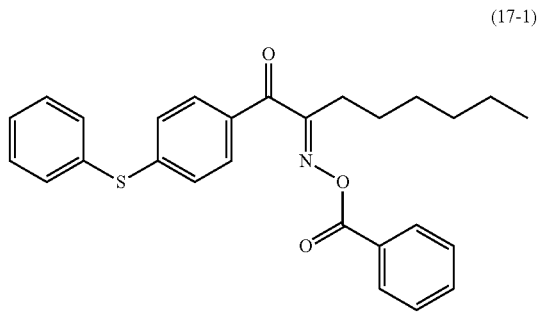
(17-1)

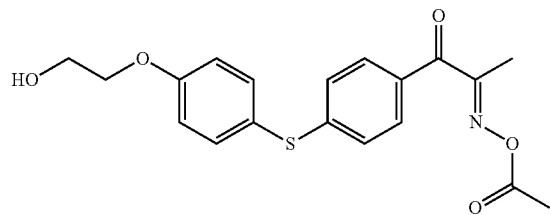
(17-2)

As the compound represented by the formula (18), a compound represented by the following formula (18-1) can be given, for example. This compound is available as DFI-091 (product name, manufactured by Daito Chemix Corporation).

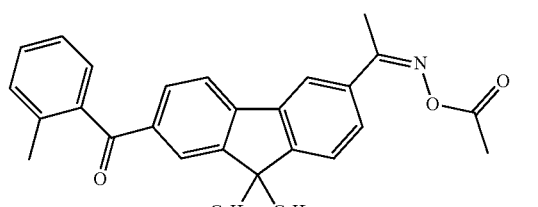
(18-1)

As the compound represented by the formula (19), a compound represented by the following formula (19-1) can be given, for example. This compound is available as Adeka Optomer N-1919 (manufactured by Adaka Corporation).

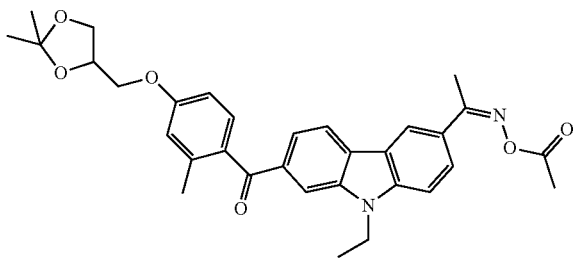

(19-1)

As other oxime ester compounds, it is preferable to use the following compound.

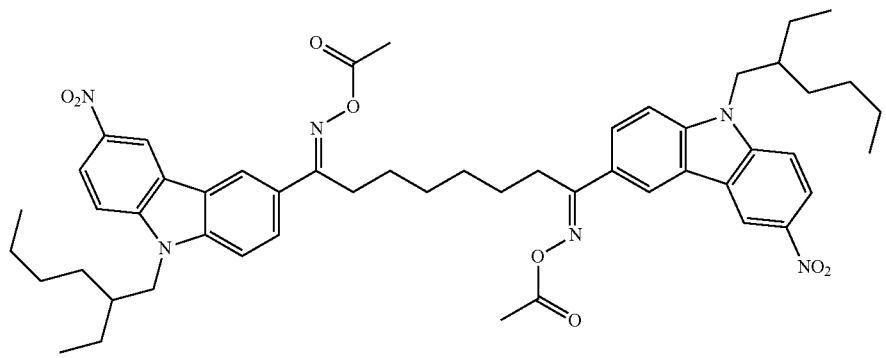 [SMILES: CCCCC(CC)Cn1c2ccc(/C(CCCCCC/C(=N\OC(C)=O)c3ccc4c(c3)c3cc([N+](=O)[O-])ccc3n4CC(CC)CCCC)=N/OC(C)=O)cc2c2cc([N+](=O)[O-])ccc21]

As the component (c), the following compound can also be used.

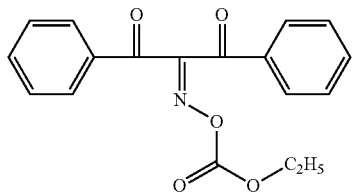 [SMILES: CCOC(=O)ON=C(C(=O)c1ccccc1)C(=O)c1ccccc1]

If the component (c) is contained, the content thereof is preferably 0.01 to 30 parts by mass, more preferably 0.01 to 20 parts by mass, further preferably 0.01 to 15 parts by mass, and particularly preferably 0.05 to 10 parts by mass relative to 100 parts by mass of the component (a). If the amount is 0.01 parts by mass or more, crosslinking of the exposed part becomes sufficient, whereby more excellent photosensitive properties can be obtained. If the amount is 30 parts by mass or less, the heat resistance of a cured film tends to be further improved.

Component (d): Solvent

The resin composition of the present invention may contain a solvent as the component (d) according to need. As the component (d), a polar solvent that completely dissolves the polyimide precursor is preferable. As examples thereof, N-methyl-2-pyrrolidone, N,N-dimethylacetamide, N,N-dimethylformamide, dimethyl sulfoxide, tetramethyl urea, hexamethyl phosphoric triamide, γ-butyrolactone, δ-valerolactone, γ-valerolactone, cyclohexanone, cyclopentanone, propylene glycol monomethyl ether acetate, propylene carbonate, ethyl lactate, 1,3-dimethyl-2-imidazolidinone or the like can be given. These can be used singly or in combination of two or more.

The resin composition of the present invention may comprise an addition-polymerizable compound as the component (e), if necessary. As examples of the addition-polymerizable compound, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, styrene, divinylbenzene, 4-vinyltoluene, 4-vinylpyridine, N-vinylpyrrolidone, 2-hydroxyethyl methacrylate, 2-hydroxyethyl acrylate, 1,3-acryloyloxy-2-hydroxypropane, 1,3-methacryloyloxy-2-hydroxypropane, methylene bisacrylamide, N,N-dimethylacrylamide, N-methylolacrylamide or the like can be given, for example. These may be used singly or in combination of two or more.

The content of the addition-polymerizable compound, if contained, is preferably 1 to 100 parts by mass relative to 100 parts by mass of the component (a), more preferably 1 to 75 parts by mass, and further preferably 1 to 50 parts by mass. If the content is 1 part by mass or more, more excellent photosensitive properties can be imparted. If the content is 100 parts by mass or less, the heat resistance of the cured film can be further improved.

In order to ensure excellent storage stability, the resin composition of the present invention may comprise a radical polymerization inhibitor or a radical polymerization retarder. As examples of the radical polymerization inhibitor or the radical polymerization retarder, p-methoxyphenol, diphenyl-p-benzoquinone, benzoquinone, hydroquinone, pyrogallol, phenothiazine, resorcinol, ortho-dinitrobenzene, para-dinitrobenzene, meta-dinitrobenzene, phenanthraquinone, N-phenyl-2-naphthylamine, cupferron, 2,5-toluquinone, tannic acid, parabenzyl aminophenol, nitrosamine or the like can be given. These may be used singly or in combination of two or more.

The content of the radical polymerization inhibitor or the radical polymerization retarder, if contained, is preferably 0.01 to 30 parts by mass, more preferably 0.01 to 10 parts by mass, and further preferably 0.05 to 5 parts by mass relative to 100 parts by mass of the polyimide precursor. If the content is 0.01 parts by mass or more, storage stability is improved. If the content is 30 parts by mass or less, heat resistance of the cured film can be further improved.

In the meantime, the resin composition of the present invention may essentially consist of the components (a) and (b) mentioned above, optionally the components (c) to (e) mentioned above, and at least one of the radical polymerization inhibitor and the radical polymerization retarder. The resin composition of the present invention may consist only of these components. The "essentially consist of" means that the above-mentioned composition comprise mainly the components (a) and (b) mentioned above, optionally the components (c) to (e) mentioned above, and at least one of the radical polymerization inhibitor and the radical polymerization retarder, and that the amount thereof is 95 wt % or more or 98 wt % or more of the entire raw material, for example.

<Cured Film and Method for Producing Patterned Cured Film>

The cured film of the present invention is a cured film formed of the resin composition mentioned above.

Further, the patterned cured film of the present invention is a patterned cured film formed from the resin composition mentioned above. The patterned cured film of the present invention is formed when the above-mentioned resin composition comprises the component (c).

The method for producing a patterned cured film of the present invention comprises a step of applying the above-mentioned resin composition to a substrate, followed by drying, thereby to form a coating film, and a step of irradiating the coating film with active rays, followed by development, thereby to obtain a patterned resin film, and a step of subjecting the patterned resin film to a heat treatment.

Hereinbelow, each step of the method for producing a patterned cured film will be explained.

The method for producing a patterned cured film according to the present invention comprises a step of applying the above-mentioned resin composition to a substrate, followed by drying, thereby to form a coating film. As the method for applying the resin composition to the a base material, a dipping method, a spray method, a screen printing method, a spin coating method or the like can be given. As the base material, silicon wafer, metal substrate, ceramic substrate or the like can be given. Since the resin composition of the present invention is capable of forming a low-stress cured film, it can preferably be applied to silicon wafer having a large diameter (e.g. 12 inches or larger).

In the drying step, it is possible to form a coating film having no tackiness by removing the solvent by heating. In the drying step, an apparatus such as DATAPLATE (Digital Hotplate, manufactured by PMC, Co. Ltd.) can be used. The drying temperature is preferably 90 to 130° C., and the drying time is preferably 100 to 400 seconds.

The method for producing a patterned cured film of the present invention comprises a step of irradiating the coating film with active rays, followed by development, thereby to obtain a patterned resin film. As a result, a resin film in which a desired pattern is formed can be obtained.

The resin composition of the invention is preferable for irradiation with i-line. As active rays to be irradiated, ultraviolet rays, far ultraviolet rays, visible rays, electron beams, X-rays or the like can be used.

The developer is not particularly limited. Examples of the developer include a flame-retardant solvent such as 1,1,1-trichloroethane; an alkaline aqueous solution such as a sodium carbonate aqueous solution and a tetramethylammonium hydroxide aqueous solution; a good solvent such as N,N-dimethylformamide, dimethyl sulfoxide, N,N-dimethylacetamide, N-methyl-2-pyrrolidone, cyclopentanone, γ-butyrolactone, and an acetic acid ester; a mixed solvent that includes the good solvent and a poor solvent such as a lower alcohol, water, or an aromatic hydrocarbon; and the like. After development, the patterned resin film is optionally rinsed with a poor solvent, or the like.

The method for producing a patterned cured film of the present invention comprises a step of subjecting a patterned resin film to a heat treatment.

In this heat treatment, a vertical thermal diffusion furnace manufactured by Koyo Lindberg, Ltd. can be used. It is preferred that the heat treatment be conducted at a temperature of 80 to 400° C. for 5 to 300 minutes. By this step, imidization of the polyimide precursor in the resin composition can proceed, whereby a patterned cured film containing a polyimide resin can be obtained.

The method for producing a cured film of the present invention comprises a step of applying a resin composition to a substrate, followed by drying, thereby to form a coating film and a step of subjecting the coating film to a heat treatment. The step of forming a coating film and the step of subjecting a coating film to a heat treatment may be conducted in the same way as in the above-mentioned method for producing a patterned cured film. The cured film of the present invention may be a cured film in which no pattern is formed.

The cured film or the patterned cured film of the present invention obtained as above can be used as a surface protective layer, an interlayer insulating layer, a re-wiring layer or the like of a semiconductor device.

FIG. 1 is a schematic cross-sectional view illustrating a semiconductor device according to one embodiment of the invention that includes a redistribution structure. The semiconductor device according to this embodiment has a multilayer wiring structure. An Al wiring layer 2 is formed on an interlayer insulating layer (interlayer insulating film) 1. An insulating layer (insulating film) 3 (e.g., P—SiN layer) is formed on the Al wiring layer 2, and a surface protective layer (surface protective film) 4 is formed on the insulating layer 3. A redistribution layer 6 is formed from a pad 5 of the wiring layer 2. The redistribution layer 6 extends to the upper side of a core 8 that is connected to a conductive ball 7 (external connection terminal) that is formed of solder, gold, or the like. A cover coat layer 9 is formed on the surface protective layer 4. The redistribution layer 6 is connected to the conductive ball 7 through a barrier metal 10. A collar 11 is provided to hold the conductive ball 7. When mounting a package having such a structure, an underfill 12 may be provided to further reduce stress.

The cured film or the patterned cured film of the present invention can be used for package applications, i.e. a cover coat material, a redistribution core material, a ball (e.g. solder) collar material, an underfill material, etc., in the above-mentioned embodiment.

Since the cured film or the patterned cured film according to the present invention exhibits excellent adhesion to a metal layer, a sealing material, and the like, exhibits excellent copper migration resistance, and has a high stress relaxation effect, the semiconductor device that includes the cured film or the patterned cured film of the present invention has significantly high reliability.

The electronic part of the present invention is not particularly restricted as long as it has a cover coat, a redistribution core, a ball (e.g. solder) collar material, an underfill used in a flip chip or the like, that use the cured film or the patterned cured film of the present invention, and may take various structures.

EXAMPLES

Hereinafter, the present invention will be explained in more detail in accordance with the Examples, which should not be construed as limiting the scope of the present invention.

Synthesis Example 1

Synthesis of pyromellitic acid-hydroxyethyl methacrylate diester

In a 0.5 L-polyethylene bottle, 43.624 g (200 mmol) of pyromellitic dianhydride that had been dried in a dryer of 160° C. for 24 hours, 54.919 g (401 mmol) of 2-hydroxyethyl methacrylate and 0.220 g of hydroquinone were dissolved in 394 g of N-methylpyrrolidone. After addition of a catalytic amount of 1,8-diazabicycloundecene, the resultant was stirred at room temperature (25° C.) for 24 hours for esterification, whereby a pyromellitic acid-hydroxyethyl methacrylate diester solution was obtained. This solution is referred to as a PMDA (HEMA) solution.

Synthesis Example 2

Synthesis of 3,3'-4,4'-biphenyltetracarboxylic acid diester

In a 0.5 L-polyethylene bottle, 30.893 g (105 mmol) of 3,3'-4,4'-biphenyltetracarboxylic dianhydride that had been dried in a dryer of 160° C. for 24 hours, 28.833 g (210 mmol) of 2-hydroxyethyl methacrylate and 0.110 g of hydroquinone were dissolved in 239 g of N-methylpyrrolidone. After addition of a catalytic amount of 1,8-diazabicycloundecene, the resultant was stirred at room temperature (25° C.) for 24 hours for esterification, whereby a pyromellitic acid-hydroxyethyl methacrylate diester solution was obtained. This solution is referred to as a s-BPDA (HEMA) solution.

Synthesis Example 3

Synthesis of 4,4'-oxydiphthalic acid diester

In a 0.5 L-polyethylene bottle, 49.634 g (160 mmol) of 4,4'-oxydiphthalic acid that had been dried in a dryer of 160° C. for 24 hours, 44.976 g (328 mmol) of 2-hydroxyethyl methacrylate and 0.176 g of hydroquinone were dissolved in 378 g of N-methylpyrrolidone. After addition of a catalytic amount of 1,8-diazabicycloundecene, the resultant was stirred at room temperature (25° C.) for 48 hours for esterification, whereby a 4,4'-oxydiphthalic acid-hydroxyethyl methacrylate diester solution was obtained. This solution is referred to as an ODPA (HEMA) solution.

Synthesis Example 4

Synthesis of Polymer I

In a 0.5 L-flask provided with a stirrer and a thermometer, 244.455 g of the PMDA (HEMA) solution obtained in Synthesis Example 1 was put. Thereafter, while cooling on ice, 25.9 g (217.8 mmol) of thionyl chloride was added dropwise by means of a dropping funnel such that the temperature of the reaction solution was maintained at 10° C. or less. After completion of dropwise addition of thionyl chloride, stirring was conducted while cooling on ice for 1 hour, whereby a PMDA (HEMA) chloride solution was obtained. Subsequently, by means of a dropping funnel, a solution of 31.696 g (99.0 mmol) of 2,2'-bis(trifluoromethyl)benzidine, 34.457 g (435.6 mmol) of pyridine and 0.076 g (0.693 mmol) of hydroquinone dissolved in 90.211 g of N-methylpyrrolidone was added dropwise carefully while cooling on ice such that the temperature of the reaction solution did not exceed 10° C. This reaction liquid was added dropwise to distilled water, and precipitated matters were collected by filtration. The collected matters were dried under reduced pressure, whereby a polyamide acid ester was obtained. The weight-average molecular weight in terms of standard polystyrene was 32,000. This polymer is referred to as polymer I. 1 g of polymer I was dissolved in 1.5 g of N-methylpyrrolidone, and the resultant was applied to a glass substrate by spin coating. Then, the substrate was heated on a hot plate of 100° C. for 180 seconds to evaporate the solvent, whereby a 20 μm-thick coating film was formed. The i-line transmittance of the resulting coating film was 17%.

Synthesis Example 5

Synthesis of Polymer II

In a 0.5 L-flask provided with a stirrer and a thermometer, 282.125 g of a s-BPDA (HEMA) solution obtained in Synthesis Example 2 was put. Subsequently, by means of a dropping funnel, 25.9 g (217.8 mmol) of thionyl chloride was added dropwise while cooling on ice such that the temperature of the reaction solution was kept at 10° C. or less. After completion of dropwise addition of thionyl chloride, stirring was conducted while cooling on ice for 1 hour, whereby a solution of s-BPDA (HEMA) chloride was obtained. Subsequently, by means of a dropping funnel, a solution of 31.696 g (99.0 mmol) of 2,2'-bis(trifluoromethyl)benzidine, 34.457 g (435.6 mmol) of pyridine and 0.076 g (0.693 mmol) of hydroquinone in 90.211 g of N-methylpyrrolidone was added dropwise carefully while cooling on ice such that the temperature of the reaction solution did not exceed 10° C. This reaction liquid was added dropwise to distilled water, and precipitated matters were collected by filtration. The collected matters were dried under reduced pressure, whereby a polyamide acid ester was obtained. The weight-average molecular weight in terms of standard polystyrene was 85,000. This polymer is referred to as polymer II. 1 g of the polymer II was dissolved in 1.5 g of N-methylpyrrolidone and the resultant was applied to a glass substrate by spin coating. Then, the substrate was heated on a hot plate of 100° C. for 180 seconds to evaporate the solvent, whereby a 20 μm-thick coating film was formed. The i-line transmittance of the resulting coating film was 60%.

Synthesis Example 6

Synthesis of Polymer III

In a 0.5 L-flask provided with a stirrer and a thermometer, 195.564 g of a PMDA (HEMA) solution obtained in Synthesis Example 1 and 58.652 g of an ODPA (HEMA) solution obtained in Synthesis Example 3 were put. Subsequently, by means of a dropping funnel, 25.9 g (217.8 mmol) of thionyl chloride was added dropwise while cooling on ice such that the temperature of the reaction liquid was kept at 10° C. or less. After completion of dropwise addition of thionyl chloride, a reaction was conducted while cooling on ice for 2 hours, whereby an acid chloride solution of PMDA (HEMA) and ODPA (HEMA) was obtained. Subsequently, by means of a dropping funnel, a solution of 31.696 g (99.0 mmol) of 2,2'-bis(trifluoromethyl)benzidine, 34.457 g (435.6 mmol) of pyridine and 0.076 g (0.693 mmol) of hydroquinone in 90.211 g of N-methylpyrrolidone was added dropwise carefully while cooling on ice such that the temperature of the reaction solution did not exceed 10° C. This reaction liquid was added dropwise to distilled water, and precipitated matters were collected by filtration. The collected matters were dried under reduced pressure, whereby a polyamide acid ester was obtained. The weight-average molecular weight in terms of standard polystyrene was 34,000. This polymer is referred to as polymer III. 1 g of the polymer III was dissolved in 1.5 g of N-methylpyrrolidone and applied to a glass substrate by spin coating. Then, the substrate was heated on a hot plate of 100° C. for 180 seconds to evaporate the solvent, whereby a 20 μm-thick coating film was formed. The i-line transmittance of the resulting coating film was 30%.

Synthesis Example 7

Synthesis of Polymer IV

In a 0.5 L-flask provided with a stirrer and a thermometer, 150.152 g of a PMDA (HEMA) solution obtained in Synthesis Example 1 and 118.335 g of an ODPA (HEMA) solution obtained in Synthesis Example 3 were put. Subsequently, by means of a dropping funnel, 25.9 g (217.8 mmol) of thionyl chloride was added dropwise while cooling on ice such that the temperature of the reaction liquid was kept at 10° C. or less. After completion of dropwise addition of thionyl chloride, a reaction was conducted while cooling on ice for 2 hours, whereby an acid chloride solution of PMDA (HEMA) and ODPA (HEMA) was obtained. Subsequently, by means of a dropping funnel, a solution of 6.305 g (29.7 mmol) of 2,2'-dimethylbenzidine, 22.187 g (69.3 mmol) of 2,2'-bis(trifluoromethyl)benzidine, 34.457 g (435.6 mmol) of pyridine and 0.076 g (0.693 mmol) of hydroquinone in 113.968 g of N-methylpyrrolidone was added dropwise carefully while cooling on ice such that the temperature of the reaction liquid did not exceed 10° C. This reaction liquid was added dropwise to distilled water, and precipitated matters were collected by filtration. The collected matters were dried under reduced pressure, whereby a polyamide acid ester was obtained. The weight-average molecular weight in terms of standard polystyrene was 34,000. This polymer is referred to as polymer IV. 1 g of the polymer IV was dissolved in 1.5 g of N-methylpyrrolidone and the resultant was applied to a glass substrate by spin coating. Then, the substrate was heated on a hot plate of 100° C. for 180 seconds to evaporate the solvent, whereby a 20 μm-thick coating film was formed. The i-line transmittance of the resulting coating film was 15%.

Synthesis Example 8

Synthesis of Polymer V

In a 0.5 L-flask provided with a stirrer and a thermometer, 181.944 g of a ODPA (HEMA) solution obtained in Synthesis Example 3 was put. Subsequently, by means of a dropping funnel, 25.9 g (217.8 mmol) of thionyl chloride was added dropwise while cooling on ice such that the temperature of the reaction liquid was kept at 10° C. or less. After completion of dropwise addition of thionyl chloride, stirring was conducted while cooling on ice for 1 hour, whereby a solution of ODPA (HEMA) chloride was obtained. Subsequently, by means of a dropping funnel, a solution of 21.017 g (99.0 mmol) of 2,2'-dimethylbenzidine, 34.457 g (435.6 mmol) of pyridine and 0.076 g (0.693 mmol) of hydroquinone in 59.817 g of N-methylpyrrolidone was added dropwise carefully while cooling on ice such that the temperature of the reaction liquid did not exceed 10° C. This reaction liquid was added dropwise to distilled water, and precipitated matters were collected by filtration. The collected matters were dried under reduced pressure, whereby a polyamide acid ester was obtained. The weight-average molecular weight in terms of standard polystyrene was 35,000. This polymer is referred to as polymer V. 1 g of the polymer V was dissolved in 1.5 g of N-methylpyrrolidone and the resultant was applied to a glass substrate by spin coating. Then, the substrate was heated on a hot plate of 100° C. for 180 seconds to evaporate the solvent, whereby a 20 μm-thick coating film was formed. The i-line transmittance of the resulting coating film was 40%.

Synthesis Example 9

Synthesis of Polymer VI

In a 0.5 L-flask provided with a stirrer and a thermometer, 244.455 g of a PMDA (HEMA) solution obtained in Synthesis Example 3 was put. Subsequently, by means of a dropping funnel, 25.9 g (217.8 mmol) of thionyl chloride was added dropwise while cooling on ice such that the temperature of the reaction liquid was kept at 10° C. or less. After completion of dropwise addition of thionyl chloride, stirring was conducted while cooling on ice for 1 hour, whereby a solution of PMDA (HEMA) chloride was obtained. Subsequently, by means of a dropping funnel, a solution of 21.017 g (99.0 mmol) of 2,2'-dimethylbenzidine, 34.457 g (435.6 mmol) of pyridine and 0.076 g (0.693 mmol) of hydroquinone in 59.817 g of N-methylpyrrolidone was added dropwise carefully while cooling on ice such that the temperature of the reaction liquid did not exceed 10° C. This reaction liquid was added dropwise to distilled water, and precipitated matters were collected by filtration. The collected matters were dried under reduced pressure, whereby a polyamide acid ester was obtained. The weight average molecular weight in terms of standard polystyrene was 27,000. This polymer is referred to as polymer VI. 1 g of the polymer VI was dissolved in 1.5 g of N-methylpyrrolidone and the resultant was applied to a glass substrate by spin coating. Then, the substrate was heated on a hot plate of 100° C. for 180 seconds to evaporate the solvent, whereby a 20 μm-thick coating film was formed. The i-line transmittance of the resulting coating film was 1%.

Synthesis Example 10

Synthesis of Polymer VII

In a 0.1 L-flask provided with a stirrer and a thermometer, 9.607 g (30 mmol) of 2,2'-bis(trifluoromethyl)benzidine was put, and dissolved in 73.735 g of N-methylpyrrolidone. Subsequently, 6.544 g (30 mmol) of pyromellitic dianhydride was added carefully to avoid heat generation. The reaction solution was stirred at room temperature (25° C.) for 5 hours to obtain a polyamide acid solution. The weight-average molecular weight in terms of standard polystyrene was 69,000. This polymer is referred to as polymer VII. 1 g of polymer VII was dissolved in 1.5 g of N-methylpyrrolidone, and the resultant was applied to a glass substrate by spin coating. Then, the substrate was heated on a hot plate of 100° C. for 180 seconds to evaporate the solvent, whereby a 20 μm-thick coating film was formed. The i-line transmittance of the resulting coating film was 50%.

The weight-average molecular weight in terms of standard polystyrene obtained by GPC of the polymers I to VII was measured by the following method. Measurement was conducted by using a solution obtained by using 1 mL of a solvent [THF/DMF=1/1 (volume ratio)] relative to 0.5 mg of a polymer.

Measurement apparatus: detector L4000 UV manufactured by Hitachi Ltd.

Pump: L6000 manufactured by Hitachi Ltd.

C-R4A Chromatopac manufactured by Shimadzu Corporation

Measurement conditions: Column Gelpack GL-S300MDT-5×2

Eluent: THF/DMF=1/1 (volume ratio)

LiBr (0.03 mol/L), $H_3PO_4$ (0.06 mol/L)

Flow rate: 1.0 mL/min, detector: UV270 nm

The i-line transmittance of the polymers I to VII was measured by using a U-3310 spectrophotometer manufactured by Hitachi Ltd.

Synthesis Example 11

In a 0.1 L-separable flask provided with a cooler, a stirrer and a dropping funnel, 8.16 g (35 mmol) of 3-isocyanatopropyltriethoxysilane (KBE-9007, manufactured by Shin-Etsu Chemical Co., Ltd.) was put. Through a dropping funnel, 2.819 g of a dilute ethanol solution (SIB-1140.0 manufactured by Gelest, Inc.) of bis(2-hydroxyethyl)-3-aminopropyltriethoxysilane was added dropwise at a speed at which the reaction proceeded at a temperature of the reaction solution of 50° C. or less. After completion of the dropwise addition, the reaction solution was heated in an oil bath of 60° C. for 3 hours. In the IR spectrum of the reaction solution after the heating, a peak derived from an isocyanate group at around 2260 $cm^{-1}$ disappeared and a peak derived from a NH group appeared at around 3370 $cm^{-1}$.

A reaction product was confirmed by disappearance of KBE-9007 by thin layer column chromatography using silica gel as a support (eluent: hexane, coupler: iodine). From the facts mentioned above, it was confirmed that an adduct (b1) of bis(2-hydroxyethyl)-3-aminopropyltriethoxysilane and 3-isocyanatopropyltriethoxysilane and an adduct (b3) of ethanol and 3-isocyanatopropyltriethoxysilane were obtained.

Synthesis Example 12

In a 0.1 L-separable flask provided with a cooler, a stirrer and a dropping funnel, 8.16 g (35 mmol) of 3-isocyanatopropyltriethoxysilane (KBE-9007, manufactured by Shin-Etsu Chemical Co., Ltd.) was put. Through a dropping funnel, 4.524 g (35 mmol) of 2-ethylhexylamine (manufactured by Merck Ltd.) was added dropwise at a speed at which the reaction proceeded at a temperature of the reaction solution of 50° C. or less. After completion of the dropwise addition, in the IR spectrum of the reaction solution, a peak derived from an isocyanate group at around 2260 $cm^{-1}$ disappeared and a peak derived from a NH group appeared at around 3370 $cm^{-1}$.

A reaction product was confirmed by disappearance of KBE-9007 by thin layer column chromatography using silica gel as a support (eluent: hexane, coupler: iodide).

From the facts mentioned above, it was confirmed that an adduct (b4) of 2-ethylhexylamine and 3-isocyanatopropyltriethoxysilane was obtained.

Synthesis Example 13

In a 0.1 L-separable flask provided with a cooler, a stirrer and a dropping funnel, 8.16 g (35 mmol) of 3-isocyanatopropyltriethoxysilane (KBE-9007, manufactured by Shin-Etsu Chemical Co., Ltd.) was put. Through a dropping funnel, a solution of 2.979 g (35 mmol) of 5-aminotetrazole dissolved in 11.56 g of N-methylpyrrolidone was added dropwise at a speed at which the reaction proceeded at a temperature of the reaction solution of 50° C. or less. After completion of the dropwise addition, in the IR spectrum of the reaction solution, a peak derived from an isocyanate group at around 2260 $cm^{-1}$ disappeared and a peak derived from a NH group appeared at around 3370 $cm^{-1}$. A reaction product was confirmed by disappearance of KBE-9007 by thin layer chromatography using silica gel as a support (eluent: hexane, coupler: iodine). From the facts mentioned above, it was confirmed that an adduct (b5) of 5-aminoterazole and 3-isocyanatopropyltriethoxysilane was obtained.

Synthesis Example 14

In a 0.1 L-separable flask provided with a cooler, a stirrer and a dropping funnel, 23.311 g (100 mmol) of 3-isocyanatopropyltriethoxysilane (KBE-9007, manufactured by Shin-Etsu Chemical Co., Ltd.) was put. Through a dropping funnel, 3.40 g (100 mmol) of methanol was added dropwise at a speed at which the reaction proceeded at a temperature of the reaction solution of 50° C. or less. After completion of the dropwise addition, the reaction liquid was heated in an oil bath of 50° C. for 6 hours. In the IR spectrum of the reaction solution after the heating, a peak derived from an isocyanate group at around 2260 $cm^{-1}$ disappeared and a peak derived from a NH group appeared at around 3370 $cm^{-1}$. A reaction product was confirmed by disappearance of KBE-9007 by using thin layer column chromatography using silica gel as a support (eluent: hexane, coupler: iodine). From the facts mentioned above, it was confirmed that an adduct (b2) of methanol and 3-isocyanatopropyltriethoxysilane was obtained.

The IR spectrum was measured by means of FTS-3000MX (manufactured by Digital Laboratory, Inc.) and by adding dropwise 0.2 g of the reaction solution to a PET film.

Examples 1 to 17 and Comparative Examples 1 to 13

Components (a) to (c) were dissolved in N-methylpyrrolidone at an amount ratio shown in Table 1, whereby a resin composition was prepared.

In Table 1, the numeral in parenthesis in each column of component (b) and component (c) indicates the amount added (parts by mass) relative to 100 parts by mass of the component (a). As the solvent, N-methylpyrrolidone was used, and the amount thereof was 1.5 times (150 parts by mass) relative to 100 parts by mass of the component (a).

In the Examples, when a photosensitive resin composition was prepared by using the component (c), tetraethylene glycol dimethacrylate was compounded in an amount of 20 parts by mass relative to the component (a).

For the resin compositions prepared in the Examples and the Comparative Examples, the residual stress of the cured film, the adhesiveness and the storage stability of the composition and the resolution at the time of film formation were measured. The results are shown in Table 1. The methods for evaluation are as follows.

(Measurement of Residual Stress)

The resulting photosensitive resin composition was applied by spin coating to a 6-inch silicon wafer. The wafer was heated on a hot plate of 100° C. for 3 minutes to evaporate the solvent, whereby a coating film of which the film thickness after curing became about 10 µm was obtained. By using a vertical diffusion furnace manufactured by Koyo Lindberg, Ltd., the coating film was cured by heating in nitrogen atmosphere at 375° C. for 1 hour, whereby a polyimide film (cured film) was obtained. The residual stress of the polyimide film after curing was measured at room temperature by means of a stress measurement apparatus for a thin film (FLX-2320 manufactured by KLA Tencor Corporation).

(Evaluation of Adhesiveness)

The resulting photosensitive resin composition was applied by spin coating to a 6-inch silicon wafer. The wafer was heated on a hot plate of 100° C. for 3 minutes to evaporate the solvent, whereby a coating film of which the film thickness after curing became about 10 µm was obtained. By using a vertical diffusion furnace manufactured by Koyo Lindberg, Ltd., the coating film was cured by heating in nitrogen atmosphere at 375° C. for 1 hour, whereby a polyimide film (cured film) was obtained. In order to confirm the adhesiveness between the polyimide film and the silicon wafer used as the substrate, after exposing for 100 hours under conditions of 121° C., 2 atm and 100% RH, the polyimide film was subjected to a cross cut test (JIS K5400-8.5 (JIS D0202)).

A case where 95 grids of the polyimide film remained on the substrate was evaluated as A, a case where 85 to 94 grids of the polyimide film remained on the substrate was evaluated as B, and a case where 84 or less of grids remained on the substrate was evaluated as C. B or higher was evaluated as having excellent adhesiveness.

(Evaluation of Storage Stability)

The resulting resin composition was applied by spin coating to a 6-inch silicon wafer. The resultant was heated on a hot plate of 100° C. for 3 minutes to evaporate the solvent, whereby a coating film having a film thickness of about 10 µm was obtained. The film thickness at this time was taken as the initial film thickness. After storing the resin composition at 25° C. for 7 days, under the similar conditions to those for the measurement of the initial film thickness, the resin composition was applied to a 6-inch wafer. The wafer was heated on a hot plate of 100° C. for 3 minutes to evaporate the solvent, whereby a coating film was obtained.

A case where the difference between the initial film thickness and the film thickness after the storage for 7 days was within ±0.5 µm was evaluated as A, a case where the difference between the initial film thickness and the film thickness after the storage for 7 days was 0.6 µm or more and 1.0 µm or less was evaluated as B, and a case where the difference between the initial film thickness and the film thickness after the storage for 7 days was larger than 1.0 µm was evaluated as C. B or higher was evaluated as having excellent storage stability.

(Evaluation of Photosensitive Characteristics (Resolution))

Evaluation was conducted for a resin composition to which the component (c) had been added. The resin composition was applied to a 6-inch wafer by spin coating. The wafer was heated on a hot plate of 100° C. for 3 minutes to evaporate the solvent, whereby a coating film having a thickness of 10 µm was obtained. The coating film was immersed in a mixed solvent of γ-butyrolactone:butyl acetate=7:3, and the period of time that was twice the time until the film was completely dissolved was taken as the developing time. For the coating film obtained by the similar process, through a photomask, the wafer that had been exposed to i-line (300 mJ/cm$^2$) by using an i-line stepper (FPA-3000 iW) manufactured by Canon Corp. was immersed in a γ-butyrolactone:butyl acetate=7:3 for conducting paddle development. Thereafter, the wafer was rinsed with cyclopentanone. The minimum value of the mask dimension of the line-and-space pattern that had been resolved was evaluated as resolution.

TABLE 1

| Item | Component (a) | Component (b) | Component (c) | Stress (MPa) | Adhesiveness | Stability | Resolution (um) |
|---|---|---|---|---|---|---|---|
| Ex. 1 | Polymer I | b3(3) | None | 17 | A | A | — |
| Ex. 2 | Polymer I | b3(3) | C2(2) | 17 | A | B | 7 |
| Ex. 3 | Polymer II | b3(3) | None | 30 | A | A | — |
| Ex. 4 | Polymer II | b3(3) | C2(2) | 28 | B | A | 7 |
| Ex. 5 | Polymer III | b1(1.8) + b3(1.2) | None | 7 | A | B | — |
| Ex. 6 | Polymer III | b1(1.8) + b3(1.2) | C2(2) | 18 | A | A | 6 |
| Ex. 7 | Polymer III | b1(3.6) + b3(2.4) | C2(2) | 17 | A | A | 7 |
| Ex. 8 | Polymer III | b2(3) | C1(6) | 22 | B | A | 8 |
| Ex. 9 | Polymer III | b3(3) | C2(2) | 24 | A | B | 7 |
| Ex. 10 | Polymer III | b3(6) | C2(2) | 23 | B | A | 8 |
| Ex. 11 | Polymer III | b4(3) | C2(2) | 24 | A | B | 6 |
| Ex. 12 | Polymer III | b5(3) | C2(2) | 21 | B | B | 7 |
| Ex. 13 | Polymer III | b1(1.8) + b3(1.2) + b4(3) | C2(2) | 22 | A | A | 6 |
| Ex. 14 | Polymer IV | b3(3) | None | 20 | A | A | — |
| Ex. 15 | Polymer IV | b3(3) | C2(2) | 26 | A | B | 8 |
| Ex. 16 | Polymer VII | b3(3) | None | 6 | A | A | — |
| Ex. 17 | Polymer VI | b5(3) | C2(2) | 2 | B | B | 7 |
| Comp. Ex. 1 | Polymer I | None | C2(2) | 17 | C | A | 20 |
| Comp. Ex. 2 | Polymer II | None | C2(2) | 28 | C | A | 30 |
| Comp. Ex. 3 | Polymer III | None | C2(2) | 24 | C | A | 40 |
| Comp. Ex. 4 | Polymer IV | None | C2(2) | 23 | C | A | 30 |
| Comp. Ex. 5 | Polymer I | b6(3) | C2(2) | 17 | C | C | 8 |
| Comp. Ex. 6 | Polymer II | b7(3) | C2(2) | 28 | C | C | 7 |
| Comp. Ex. 7 | Polymer III | b8(3) | C2(2) | 24 | C | C | 8 |
| Comp. Ex. 8 | Polymer IV | b9(3) | C2(2) | 23 | C | C | 6 |
| Comp. Ex. 9 | Polymer V | b6(3) | C2(2) | 35 | B | C | 8 |
| Comp. Ex. 10 | Polymer VI | b7(3) | C2(2) | 2 | B | C | 6 |

TABLE 1-continued

| Item | Component (a) | Component (b) | Component (c) | Stress (MPa) | Adhesiveness | Stability | Resolution (um) |
|---|---|---|---|---|---|---|---|
| Comp. Ex. 11 | Polymer VII | None | None | 6 | C | B | — |
| Comp. Ex. 12 | Polymer VII | b9(3) | None | 6 | C | A | — |
| Comp. Ex. 13 | Polymer II | b9(4) | C3(3) | 7 | C | A | No pattern was obtained |

In Table 1, the component (b) is a compound represented by the following structural formula.

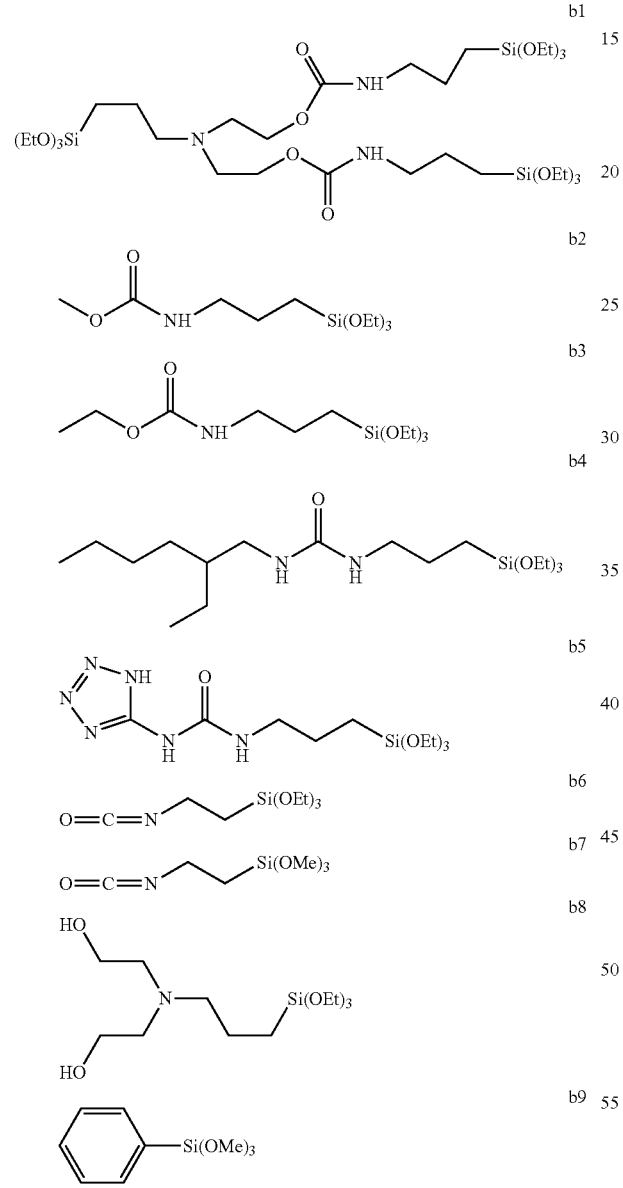

b6: 3-isocyanatopropyltriethoxysilane (manufactured by Shin-Etsu Chemical Co., Ltd., KBE-9007)
b7: 3-isocyanatopropyltrimethoxysilane (MOMENTIVE, manufactured by performance materials Co., Ltd., Y-5187)
b8: Bis(2-hydroxyethyl)-3-aminopropyltriethoxysilane (manufactured by Gelest Inc., SIB-1140)
b9: Phenyltrimethoxysilane (manufactured by Shin-Etsu Chemical Co., Ltd., KBM-103)

In Table 1, the component (c) is a compound shown below.

c1: 1-phenyl-1,2-propanedione-2-(o-ethoxycarbonyl)oxime
c2: 1,2-octanedione, 1-[4-(phenylthio)phenyl-2-(O-benzoyloxime)] (the following (c2): IRGACURE OXE-01 manufactured by Chiba Specialty Chemicals K.K.)

(c2)

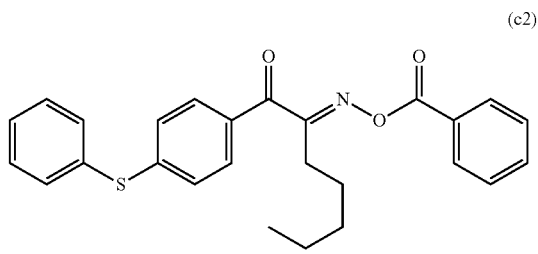 [SMILES: CCCCC/C(=N\OC(=O)c1ccccc1)C(=O)c1ccc(Sc2ccccc2)cc1]

c3: bis(cyclopentadienyl)bis(2,6-difluoro-3(1H-pyrrolo-yl)phenyl)titanium Ltd.)

Among the polymers as the component (a), one having a fluorine-substituted benzidine skeleton as a diamine component has high i-line transmittance. By using in combination with pyromellitic dianhydride or 3,3'-4,4'-biphenyltetracarboxylic acid as an acid component, a resin composition having a low stress can be obtained. When a component different from the component (b) of the present invention was used, attainment of both adhesiveness and storage stability could not be realized.

INDUSTRIAL APPLICABILITY

The resin composition of the present invention can be used for package applications such as a cover coat material, a core material for redistribution, a ball (e.g. solder) collar material, an underfill material or the like that form an electronic part of a semiconductor device or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification, and the specification of the Japanese application claiming priority under the Paris Convention are incorporated herein by reference in its entirety.

The invention claimed is:
1. A negative-type photosensitive resin composition comprising the following components (a) to (C):
(a) a polyimide precursor having a structural unit represented by the following general formula (1);

(b) a compound represented by the following general formula (2); and (c) a compound that generates a radical upon irradiation with active rays:

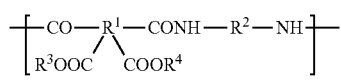

(1)

wherein in the formula, $R^1$ is a tetravalent organic group, $R^2$ is a divalent organic group, $R^3$ and $R^4$ are independently a hydrogen atom, an alkyl group, a cycloalkyl group or a monovalent organic group having a carbon-carbon unsaturated double bond, and at least one of $R^3$ and $R^4$ is an acryloxyalkyl group having 1 to 10 carbon atoms or a methacryloxyalkyl group having 1 to 10 carbon atoms;

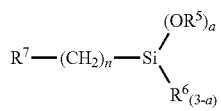

(2)

wherein in the formula, $R^5$ is an alkyl group having 1 to 4 carbon atoms, $R^6$ is independently a hydroxyl group or an alkyl group having 1 to 4 carbon atoms, a is an integer of 0 to 3, n is an integer of 1 to 6, and $R^7$ is a group represented by the following general formula (3) or (4);

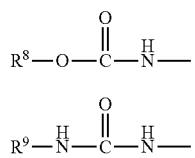

(3)

(4)

wherein in the formulas, $R^8$ is an alkyl group having 1 to 10 carbon atoms or a monovalent organic group derived from hydroxyalkylsilane and $R^9$ is an alkyl group having 1 to 10 carbon atoms, a monovalent organic group derived from aminoalkylsilane or a heterocyclic group, and $R^8$ and $R^9$ may independently have a substituent, and wherein the component (b) is at least one of the following compounds:

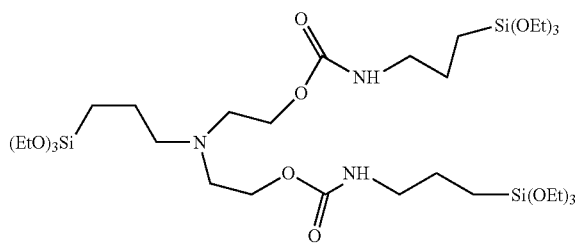

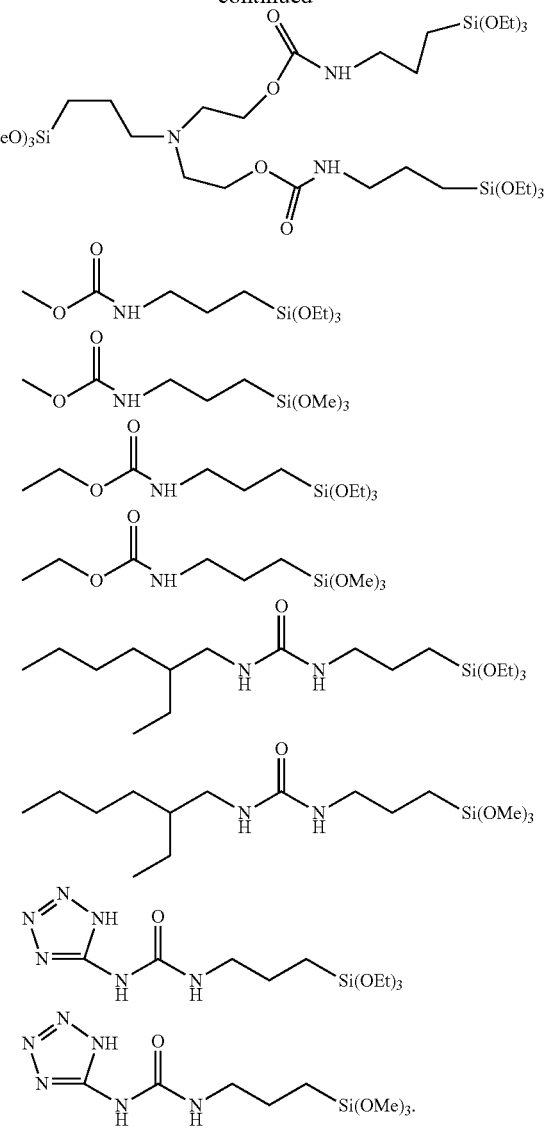

wherein upon irradiation, an irradiated portion of the compound becomes insoluble and forms a negative image.

2. The resin composition according to claim 1, wherein $R^2$ in the general formula (1) is a divalent organic group represented by the following general formula (5):

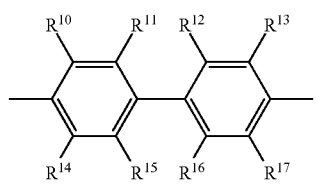

(5)

wherein in the formula, $R^{10}$ to $R^{17}$ are independently a hydrogen atom, a fluorine atom or a monovalent organic group, and at least one of $R^{10}$ to $R^{17}$ is a fluorine atom or a trifluoromethyl group.

3. The resin composition according to claim 1, wherein $R^2$ in the general formula (1) is a divalent organic group represented by the general formula (6):

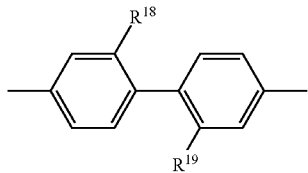

wherein in the formula, $R^{18}$ and $R^{19}$ are independently a fluorine atom or a trifluoromethyl group.

4. The resin composition according to claim 1, wherein the component (c) is an oxime ester compound.

5. A cured film formed from the resin composition according to claim 1.

6. A method for producing a cured film, the method comprising the steps of:

applying to a substrate the resin composition according to claim 1, followed by drying, thereby to form a coating film; and subjecting the coating film to a heat treatment.

7. A patterned cured film formed from the resin composition according to claim 1.

8. A method for producing a patterned cured film, the method comprising the steps of:

applying the resin composition according to claim 1 to a substrate, followed by drying, thereby to form a coating film;

irradiating the coating film with active rays, followed by development, thereby to form a patterned resin film; and subjecting the patterned resin film to a heat treatment.

9. The resin composition according to claim 1, wherein the component (c) is an oxime organic ester.

10. The method according to claim 8, wherein the component (c) is an oxime organic ester.

* * * * *